(12) United States Patent
Ebisawa

(10) Patent No.: US 8,464,653 B2
(45) Date of Patent: Jun. 18, 2013

(54) APPLICATION DEVICE AND METHOD OF PRODUCING APPLICATION LAYER USING SAME

(75) Inventor: Isao Ebisawa, Hamura (JP)

(73) Assignee: Casio Computer Co., Ltd., Tokyo (JP)

( * ) Notice: Subject to any disclaimer, the term of this patent is extended or adjusted under 35 U.S.C. 154(b) by 240 days.

(21) Appl. No.: 12/858,575

(22) Filed: Aug. 18, 2010

(65) Prior Publication Data
US 2011/0052819 A1    Mar. 3, 2011

(30) Foreign Application Priority Data

Aug. 26, 2009  (JP) ................................ 2009-196027

(51) Int. Cl.
*B05C 7/06* (2006.01)
*B05C 5/00* (2006.01)
*B05B 3/00* (2006.01)

(52) U.S. Cl.
USPC ............ 118/313; 118/315; 118/300; 118/323

(58) Field of Classification Search
USPC .................... 118/300, 313–315, 323; 347/47, 347/49; 427/64, 68, 256, 421.1, 424
See application file for complete search history.

(56) References Cited

U.S. PATENT DOCUMENTS

| 5,563,641 | A  | * | 10/1996 | Plesinger .......................... 347/47 |
| 6,514,343 | B1 |   | 2/2003  | Motoda |
| 6,817,698 | B2 | * | 11/2004 | Verlinden et al. ................ 347/47 |
| 7,331,650 | B2 | * | 2/2008  | Hawkins et al. ................. 347/44 |
| 7,393,081 | B2 | * | 7/2008  | Maekawa et al. ................ 347/40 |
| 7,455,879 | B2 |   | 11/2008 | Iguchi et al. |
| 2005/0008769 | A1 |   | 1/2005 | Sakai |
| 2005/0146558 | A1 | * | 7/2005 | Murakami et al. .............. 347/40 |
| 2006/0290764 | A1 | * | 12/2006 | Nagae et al. ................... 347/107 |

FOREIGN PATENT DOCUMENTS

| CN | 1216149 A | 5/1999 |
| JP | 63-194769 A | 8/1988 |
| JP | 64-031420 A | 2/1989 |
| JP | 10-334805 A | 12/1998 |
| JP | 2002-075640 A | 3/2002 |
| JP | 2003-035711 A | 2/2003 |
| JP | 2004-031077 A | 1/2004 |
| JP | 2004-358299 A | 12/2004 |
| JP | 2007-021781 A | 2/2007 |

(Continued)

OTHER PUBLICATIONS

Korean Office Action dated Sep. 16, 2011 (and English translation thereof) in counterpart Korean Application No. 10-2010-0082659.
Japanese Office Action dated Sep. 20, 2011 (and English translation thereof) in counterpart Japanese Application No. 2009-196027.

(Continued)

*Primary Examiner* — Yewebdar Tadesse
(74) *Attorney, Agent, or Firm* — Holtz, Holtz, Goodman & Chick, P.C.

(57) ABSTRACT

An application device comprises a liquid tank for retaining a liquid, and a discharge unit to which the liquid is supplied from the liquid tank, and which discharges the liquid to an application-target area of an object at a set application width. The discharge unit comprises a head cylinder filled with the liquid supplied from the liquid tank, and the nozzle plate which is provided at one end of the head cylinder in a replaceable manner and which is provided with plural nozzle holes discharging the liquid. The application width can be changed by merely replacing the nozzle plate without changing of an application condition.

11 Claims, 21 Drawing Sheets

FOREIGN PATENT DOCUMENTS

| | | |
|---|---|---|
| JP | 2007-044627 A | 2/2007 |
| JP | 2007-069449 A | 3/2007 |
| JP | 2007-105739 A | 4/2007 |
| JP | 2007-136408 A | 6/2007 |
| TW | 501163 B | 9/2002 |

OTHER PUBLICATIONS

Chinese Office Action dated Aug. 31, 2012 (and English translation thereof) in counterpart Chinese Application No. 201010266761.3.

\* cited by examiner

FIG. 20A  FIG. 20B  FIG. 20C
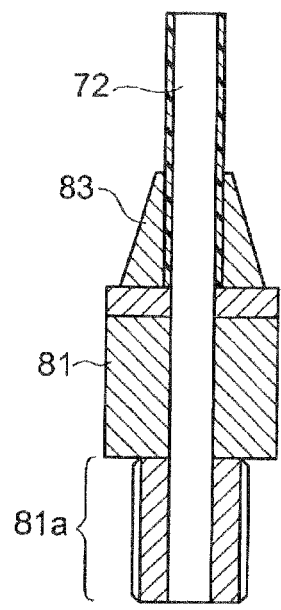
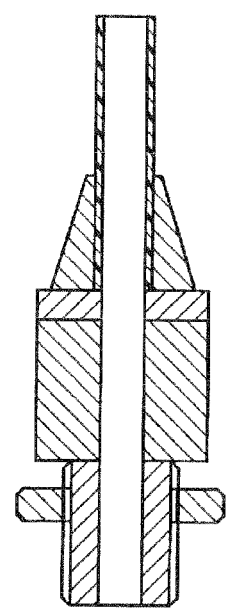
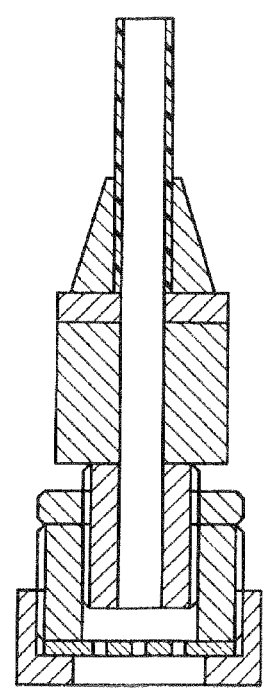
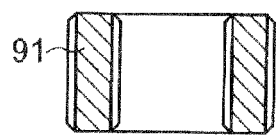
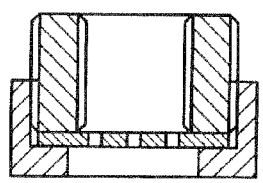
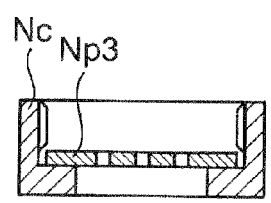

FIG. 21A  FIG. 21B
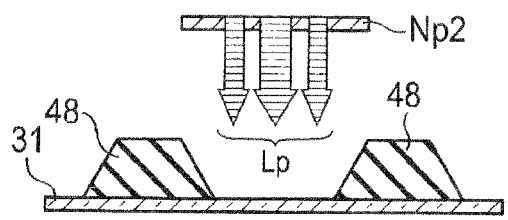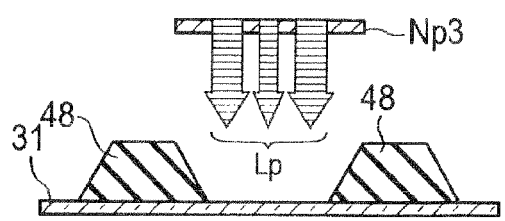
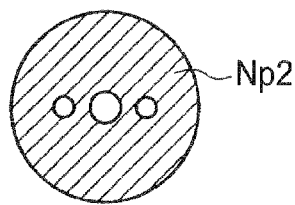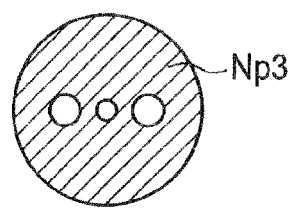
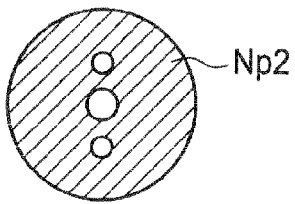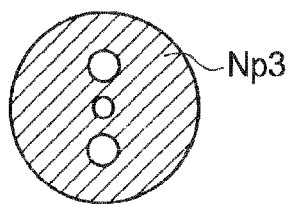
FIG. 22A  FIG. 22B
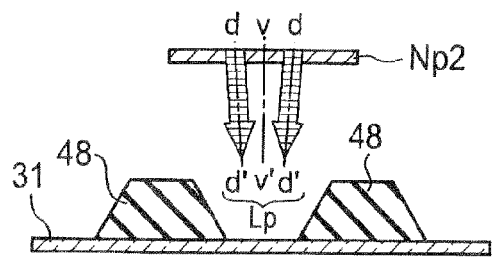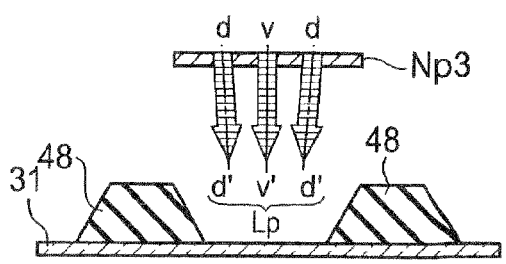

APPLICATION DEVICE AND METHOD OF PRODUCING APPLICATION LAYER USING SAME

CROSS-REFERENCE TO RELATED APPLICATION

This application claims the benefit of Japanese Patent Application No. 2009-196027, filed on Aug. 26, 2009, the entire disclosure of which is incorporated by reference herein.

FIELD

This application relates generally to an application device and a method of producing an application layer using same.

BACKGROUND

Organic electroluminescence devices (organic EL devices) are formed of fluorescent organic compounds which emit light as an electric field is applied thereto. Display devices having a display panel with each pixel being formed of an organic light emitting diode (hereinafter, an OLED) using the above-explained organic EL device are getting attention as next-generation display devices.

An organic EL device includes an anode electrode, a cathode electrode, and an organic EL layer (organic layer) which is formed between a pair of those electrodes and which includes a light emission layer, a hole-injecting layer, etc. The organic EL devices emit light using an energy generated as a hole and an electron recombine with each other in the light emission layer.

The light emission layer, the hole-injecting layer, etc., of such organic EL devices are formed by applying a liquid containing materials of the light emission layer and the hole-injecting layer to an area partitioned by a partition wall, and by letting the solvent in the liquid to dry. For application of the liquid, e.g., a nozzle-printing type application device is used.

Such an application device includes a nozzle head, and the nozzle head has a nozzle hole formed at the leading end thereof and for discharging the liquid subjected to application. As the nozzle head is pressurized, the liquid to be discharged is applied as a liquid column.

For example, Unexamined Japanese Patent Application KOKAI Publication No. 2002-75640 discloses a production method of an organic EL display device. The method uses a nozzle-printing type application device, forms a trench corresponding to a predetermined pattern where an organic EL material is to be applied on a substrate, and the substrate and a nozzle head are relatively moved so that a nozzle hole moves along the trench, thereby allowing a liquid containing the organic EL material to flow in the trench from the nozzle hole to apply such a liquid.

Meanwhile, organic EL devices have nonuniform light emission if the film thickness of the organic EL layer is nonuniform. Accordingly, in order to accomplish uniform light emission, it is necessary to control the film thickness of the organic EL layer appropriately, and to form a film having good uniformity.

According to the above-explained nozzle-printing type application device, orange of an apply area to which an apply condition adjusted so that a liquid column can be stably discharged from the nozzle hole of the nozzle head relative to an apply area with a certain size can apply appropriately is narrow, and every time the size of an apply area changes, an apply condition needs to be re-adjustment. That is, an apply condition largely changes when an organic EL material is applied to a narrow apply area in a relatively-small panel with relatively-small pixel size and with high pixel fineness and when an organic EL material is applied to a relatively-wide apply area with relatively-large pixel size and with low pixel fineness like a large-size TV.

For example, in order to increase the apply amount corresponding to a case in which a pixel is relatively large, it is an option to increase the eject speed of a liquid column by increasing liquid pressure. However, the speed for forming or maintaining a liquid column has limitations. Moreover, if the eject speed can be increased, the collision speed of a liquid against an apply area increases, resulting in splash of the liquid and spread out thereof.

Moreover, in order to increase the apply amount, it is another option to increase the size of a nozzle hole. However, as the discharge amount is proportional to the area of the nozzle hole and the nozzle area is a square of the diameter of the nozzle hole to be enlarged, a nozzle enlarging work must be highly precise. Moreover, re-adjustment of a condition of forming a liquid column becomes necessary with respect to the diameter of the nozzle hole, and the range of parameters which enables formation of respective kinds of liquid columns is not wide.

Furthermore, if the discharge amount can be increased by increasing the diameter of a nozzle hole, a liquid column formed by a discharged liquid lands on a point in an apply area, so that it is difficult to uniformly and thinly apply the liquid across a wide apply area, resulting in unevenness.

SUMMARY

The present invention is advantageous for providing an application device which can uniformly apply a liquid to application-target areas with various sizes without needing re-adjustment of an application condition, and a method of producing an application layer using the application device.

In order to accomplish the foregoing advantage, an application device according to a first aspect of the present invention comprises: a liquid tank for retaining a liquid; and a discharge unit to which the liquid is supplied from the liquid tank, and which discharges the liquid to an application-target area of an object at a set application width, wherein the discharge unit comprises: a head cylinder filled with the liquid supplied from the liquid tank; and a nozzle plate which is provided at one end of the head cylinder in a replaceable manner and which is provided with plural nozzle holes discharging the liquid.

In order to accomplish the foregoing advantage, an application device according to a second aspect of the present invention comprises: a liquid tank for retaining a liquid; a discharge unit to which the liquid is supplied from the liquid tank, and which discharges the liquid to at least one application-target area extending in a first direction formed on a substrate; and a moving unit which moves one of the discharge unit and the substrate relative to the other along the application-target area, wherein the moving unit moves the discharge unit relatively in the first direction along the application-target area, and moves one of the discharge unit and the substrate relative to the other in a second direction orthogonal to the first direction in a plane along an upper surface of the substrate when the discharge unit is moved to an end or another end of the application-target area in the first direction, the discharge unit comprises a head cylinder filled with the liquid supplied from the liquid tank, and a nozzle plate which is provided at one end of the head cylinder in a replaceable manner, and which is provided with plural nozzle holes arranged side by side on a straight line along the second direction, the plural nozzle holes each discharging the liquid, and an application width set by a clearance between respective centers of the plural nozzle holes of the nozzle plate and by a nozzle diameter of each nozzle hole is set to be a value corresponding to a width of the application-target area of the object in the second direction.

In order to accomplish the foregoing advantage, an application device according to a third aspect of the present invention comprises: a liquid tank for retaining a liquid; a discharge unit to which the liquid is supplied from the liquid tank, and discharges the liquid to at least one application-target area extending in a first direction formed on a substrate; and a moving unit which moves one of the discharge unit and the substrate relative to the other along the application-target area, wherein the moving unit moves the discharge unit relatively in the first direction along each application-target area, and moves one of the discharge unit in a second direction orthogonal to the first direction in a plane along an upper surface of the substrate when moving the discharge unit to an end or another end of the application-target area in the first direction, the discharge unit comprises a head cylinder tilled with the liquid supplied from the liquid tank, a nozzle plate which is provided at one end of the head cylinder, and which is provided with plural nozzle holes arranged side by side on a straight line, the plural nozzle holes each discharging the liquid, and a rotating mechanism which makes a rotating angle of an arrangement direction of the plural nozzle holes of the nozzle plate changeable relative to the first direction in a plane along an upper surface of the substrate, and the rotating angle is set to be a value in such a way that an application width set by a width of the plural nozzle holes of the nozzle plate in the second direction in accordance with the rotating angle becomes a value corresponding to a width of the application-target area of the object in the second direction.

In order to accomplish the foregoing advantage, according to a fourth aspect of the present invention, there is provided a method of producing an application layer on an application-target area which is provided on a substrate and extends in a first direction, the method comprising: an application step of causing a discharge unit to which a liquid is supplied from a liquid tank retaining the liquid to discharge the liquid to the application-target area at a set application width; a moving step of moving one of the discharge unit and the substrate relative to the other while allowing the discharge unit to discharge the liquid through the application step, and of moving the discharge unit relatively in the first direction along the application-target area; and an application-layer forming step of letting the liquid applied to the application-target area to dry to form the application layer on the application-target area, wherein the application step includes: a discharge unit preparing step of preparing a specific discharge unit, as the discharge unit, comprising a head cylinder which is filled with the liquid supplied from the liquid tank, and a nozzle plate provided at one end of the head cylinder, in a replaceable manner, the nozzle plate being provided with plural nozzle holes each discharging the liquid, the plural nozzle holes being arranged side by side on a straight line along a second direction orthogonal to the first direction, a nozzle plate providing step of preparing a specific nozzle plate, as the nozzle plate, having specific plural nozzle holes which set the application width by a clearance between respective centers of the specific plural nozzle holes and by a nozzle diameter of each specific plural nozzle hole as to make the application width to a value corresponding to a width of the coating-target area in the second direction, and providing the specific nozzle plate at the one end of the head cylinder of the specific discharge unit.

In order to accomplish the foregoing advantage, according to a fifth aspect of the present invention, there is provided a method of producing an application layer on an application-target area which is provided on a substrate and extends in a first direction, the method comprising: an application step of causing a discharge unit to which a liquid is supplied from a liquid tank retaining the liquid to discharge the liquid to the application-target area at a set application width; a moving step of moving one of the discharge unit and the substrate relative to the other while allowing the discharge unit to discharge the liquid through the application step, and of moving the discharge unit relatively in the first direction along the application-target area; and atm application-layer forming step of letting the liquid applied to the application-target area to dry to form the application layer on the application-target area, wherein the application step includes: a discharge unit preparing step of preparing a specific discharge unit, as the discharge unit, comprising a head cylinder which is filled with the liquid supplied from the liquid tank, a nozzle plate which is provided at one end of the head cylinder, and which is provided with plural nozzle holes arranged side by side on a straight line, the plural nozzle holes each discharging the liquid, and a rotating mechanism which makes a rotating angle of an arrangement direction of the plural nozzle holes of the nozzle plate changeable relative to the first direction in a plane along an upper surface of the substrate as the discharge unit, and an application width setting step of setting the application width set by a width of the plural nozzle holes of the nozzle plate in the second direction in accordance with the rotating angle as to become the application width to a value in accordance with a width of the application-target area in the second direction.

BRIEF DESCRIPTION OF THE DRAWINGS

A more complete understanding of this application can be obtained when the following detailed description is considered in conjunction with the following drawings, in which:

FIG. 20A is a diagram showing an illustrative structure (2) of a nozzle head having a rotating mechanism;

FIG. 20B is a diagram showing the illustrative structure (2) of the nozzle head having the rotating mechanism;

FIG. 20C is a diagram showing the illustrative structure (2) of the nozzle head having the rotating mechanism;

FIG. 21A is a diagram showing a triple nozzle plate with a different nozzle diameter as a modified example;

FIG. 21B is a diagram showing a triple nozzle plate with a different nozzle diameter as a modified example;

FIG. 22A is a diagram showing a multiple nozzle plate having a nozzle hole with an inclined center line relative to a plate surface as a modified example; and FIG. 22B is a diagram showing a multiple nozzle plate having a nozzle hole with an inclined center line relative to a plate surface as a modified example.

DETAILED DESCRIPTION

An explanation will now be given of an application device, a method of producing a light emitting device using the application device, and an electronic apparatus in which the light emitting device is built according to an embodiment of the present invention with reference to the accompanying drawings.

In the present embodiment, an explanation will be given of an active-drive type light emitting device using a bottom-emission type organic EL device as an example of the light emitting device. A bottom-emission type organic EL device employs a structure that light emitted by the organic EL device is output to the exterior through a substrate on which the organic EL device is formed. Note that the light emitting device of the present embodiment may use a top-emission type organic EL device. A top-emission type organic EL device employs a structure that light emitted by the organic EL device is output to an opposite side to a substrate on which the organic EL device is formed. The light emitting device of the present embodiment is used as a display device.

FIGS. 1 to 4 are diagrams showing respective electronic apparatuses in which a light emitting device 10 produced by an application device of the present invention is built.

Figure 1A:
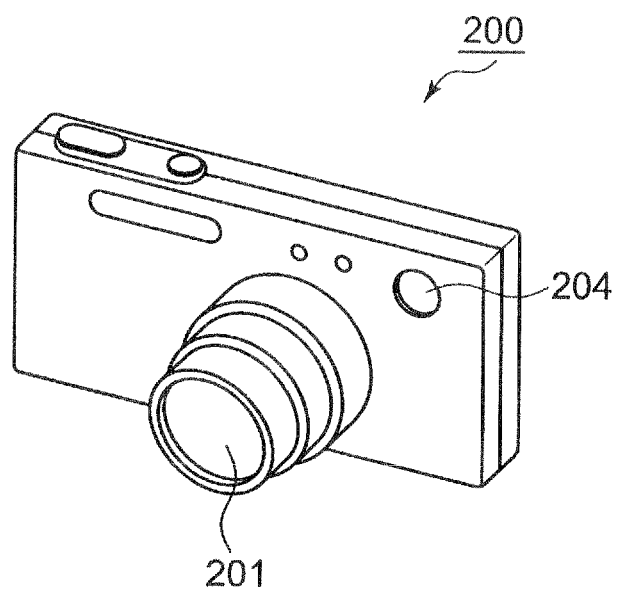
FIG. 1A is a diagram showing an electronic apparatus (digital camera) in which a light emitting device produced by an application device of the present invention is built.
Figure 1B:
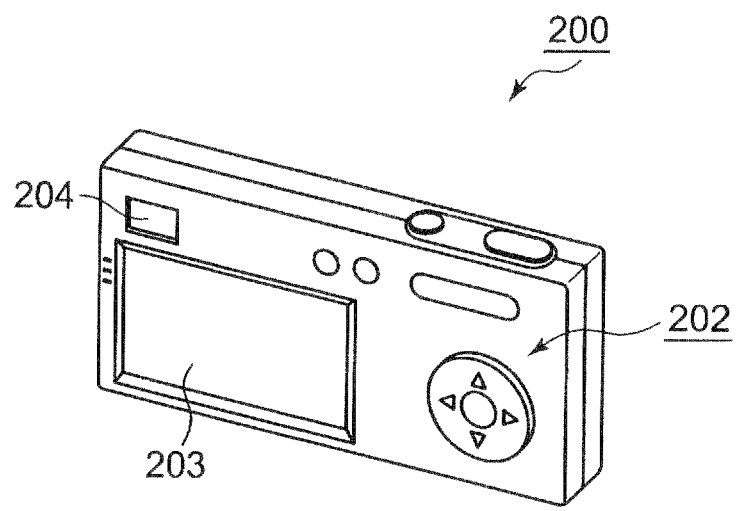
FIG. 1B is a diagram showing the electronic apparatus (digital camera) in which the light emitting device produced by the application device of the present invention is built.
Figure 2:
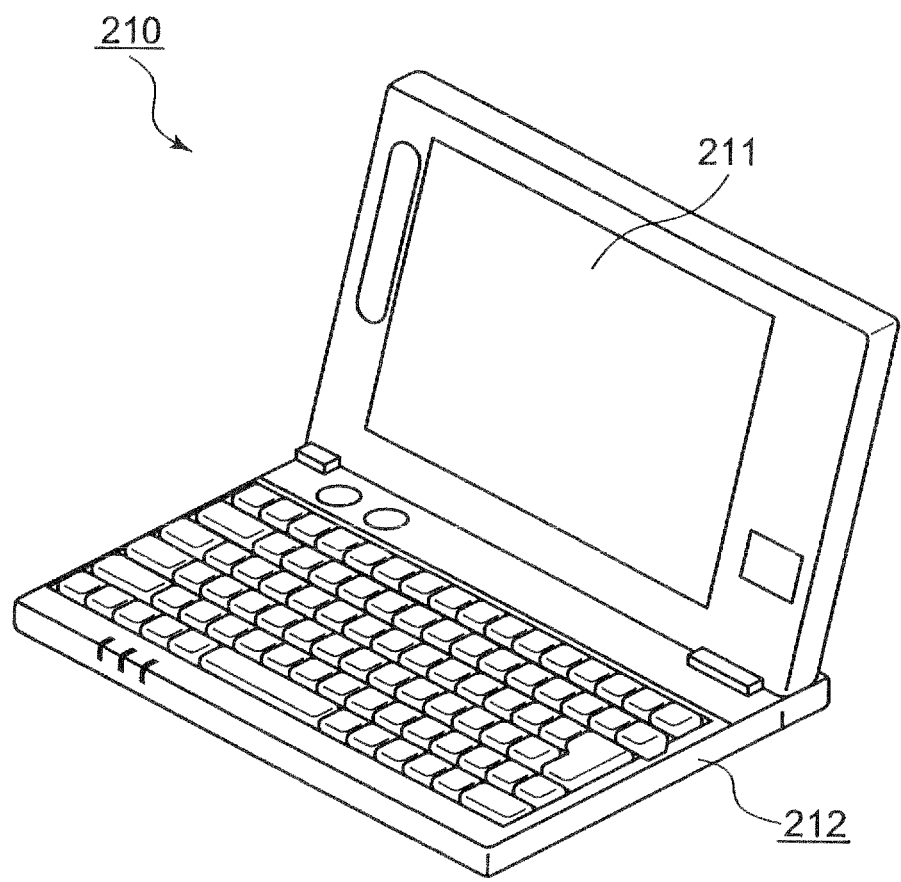
FIG. 2 is a diagram showing an electronic apparatus (computer) in which a light emitting device produced by the application device of the present invention is built.
Figure 3:
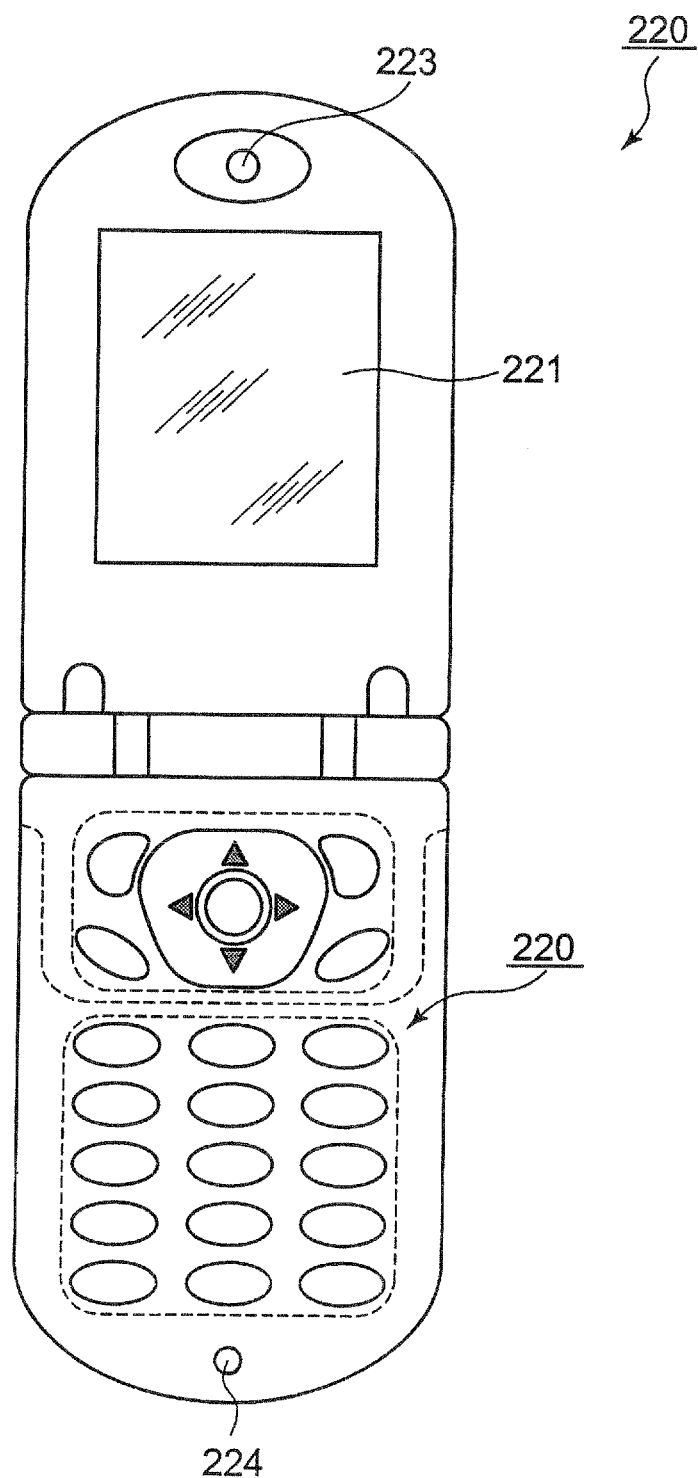
FIG. 3 is a diagram showing an electronic apparatus (cellular phone) in which a light emitting device produced by the application device of the present invention is built.

The light emitting device 10 is built in an electronic apparatus, such as a digital camera shown in FIG. 1, a computer shown in FIG. 2, a cellular phone shown in FIG. 3, or a large-sized screen television.

As shown in FIGS. 1A and 1B, a digital camera 200 includes a lens unit 201, an operation unit 202, a display unit 203, and a finder 204. The light emitting device 10 is used for the display unit 203.

A computer 210 shown in FIG. 2 includes a display unit 211 and an operation unit 212, and the light emitting device 10 is used for the display unit 211.

A cellular phone 220 shown in FIG. 3 includes a display unit 221, an operation unit 222, a receiver unit 223, and a transmitter unit 224, and the light emitting device 10 is used for the display unit 221.

Figure 4:
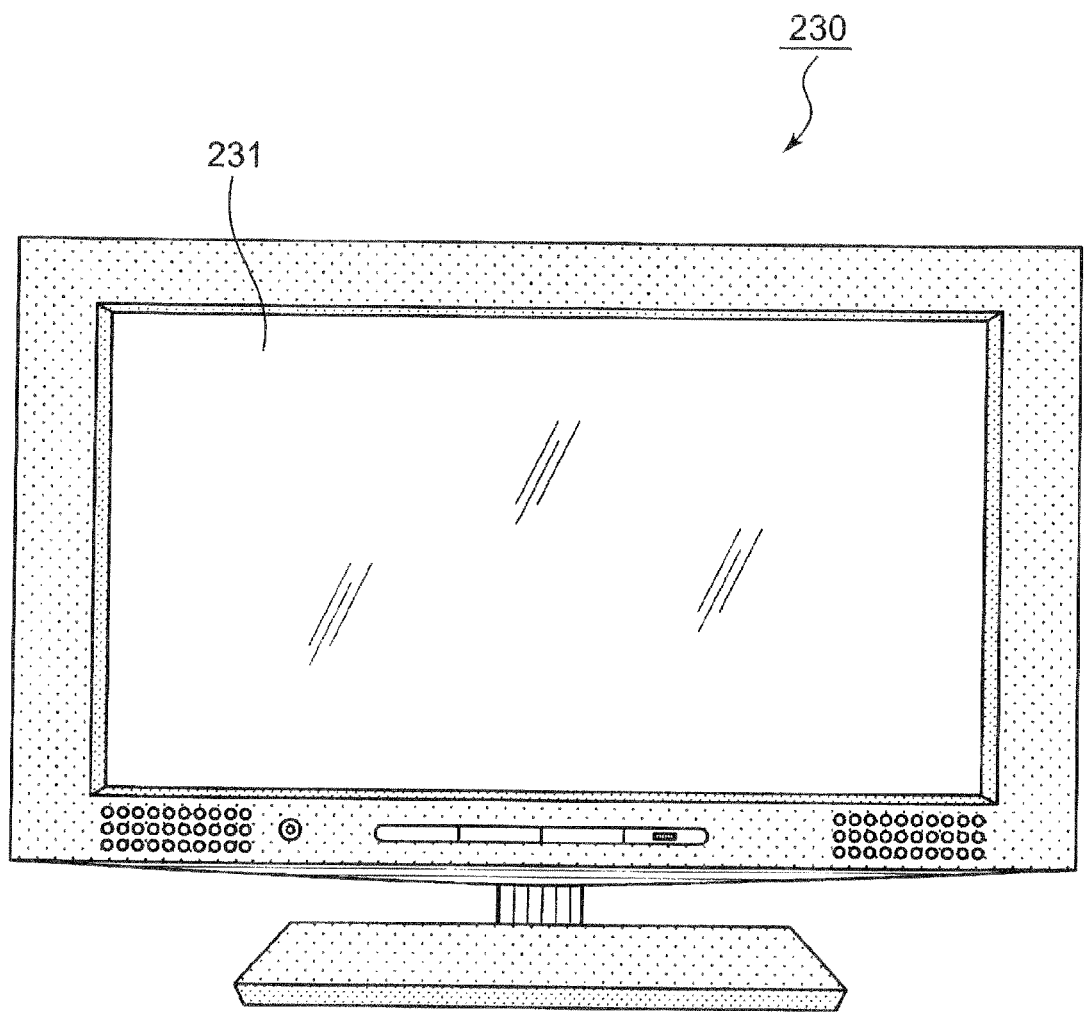
FIG. 4 is a diagram showing an electronic apparatus (large-sized screen television) in which a light emitting device produced by the application device of the present invention is built.

A large-sized screen television shown in FIG. 4 includes a display unit 231, and the light emitting device 10 is used for the display unit 231.

Next, an explanation will be given of an electrical structure of the light emitting device 10 produced by the application device of the present invention.

Figure 5:
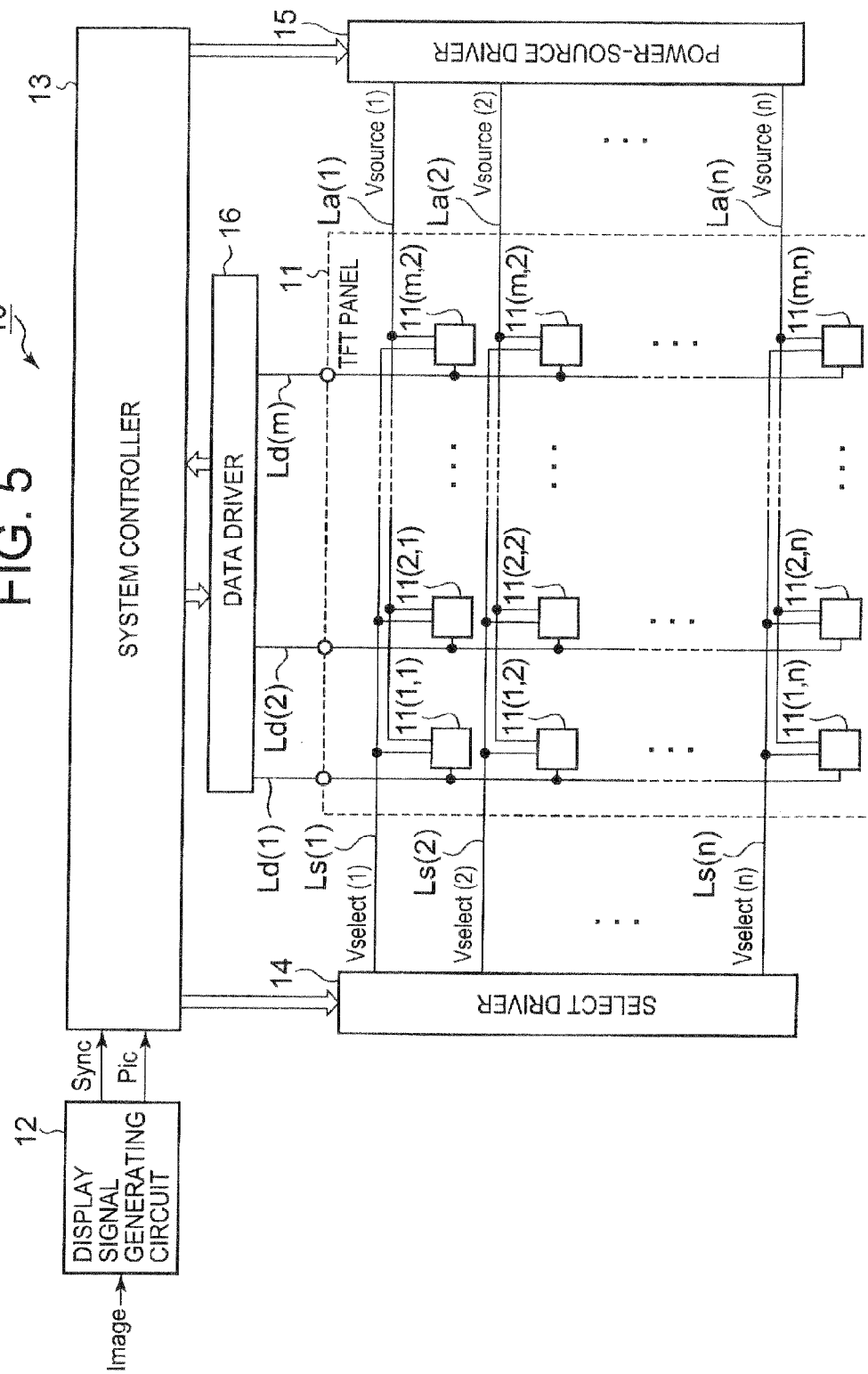
FIG. 5 is a diagram showing an illustrative electrical structure of a light emitting device produced by the application device of the present invention.
Figure 6:
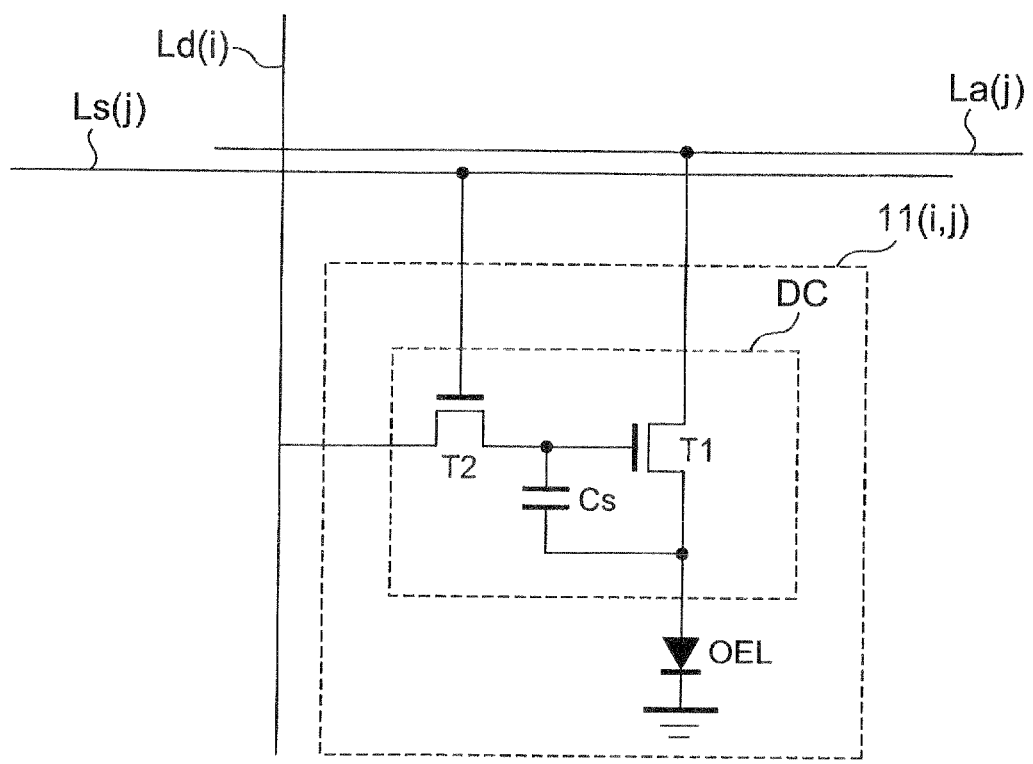
FIG. 6 is a circuit diagram showing a structure of each pixel circuit shown in FIG. 5.

FIG. 5 is a diagram showing an illustrative electrical structure of the light emitting device produced by the application device of the present invention. FIG. 6 is a circuit diagram showing a structure of each pixel circuit shown in FIG. 5.

As shown in FIG. 5, the light emitting device 10 comprises a light emitting panel (TFT panel) 11, a display signal generating circuit 12, a system controller 13, a select driver 14, a power source driver 15, and a data driver 16.

The light emitting panel 11 includes plural pixel circuits 11($i, j$) (where i=1 to m, j=1 to n, and m and n are positive integers).

Each pixel circuit 11($i, j$) is a display pixel corresponding to a pixel of an image, and arranged in a matrix pattern. As shown in FIG. 6, each pixel circuit 11($i, j$) includes an organic EL device OEL, transistors T1, T2, and a capacitor Cs. The transistors T1, T2, and the capacitor Cs configure a pixel drive circuit DC.

The organic EL device OEL is a current-control type light emitting device (display device) which emits light by utilizing a phenomenon that light is emitted by exciters produced by re-combination of an electron injected in an organic compound with a hole. The organic EL device OEL emits light at brightness corresponding to a current value of a supplied current.

The transistors T1, T2 in the pixel drive circuit DC are each a TFT (Thin Film Transistor) comprised of, for example, an n-channel FET (Field Effect Transistor).

The transistor T1 is for driving the organic EL device OEL, has a drain connected to an anode line La(j), and has a source connected to the anode electrode of the organic EL device OEL.

The transistor T2 is serving as a switch for selecting the organic EL device OEL, has a drain connected to a data line Ld(i), has a source connected to the gate of the transistor T1, and has a gate connected to a select line Ls(j) which is arranged along the row direction (X direction).

The capacitor Cs is for holding a voltage between the gate of the transistor T1 and the source thereof, and is connected between the gate of the transistor T1 and the source thereof.

When the organic EL device OEL of each pixel circuit $11(i, j)$ has any luminescent color among red (R), blue (B), and green (G), a pixel circuit $11(i, j)$ (where j to 1 to n) having an organic EL device OEL with the same luminescent color is arranged in the column direction (Y direction) along the data line Ld(i).

The pixel circuit $11(i, j)$ may comprise equal to three or greater transistors.

The display signal generating circuit 12 receives a video signal Image, such as a composite video signal or a component video signal, supplied from the exterior, and acquires a brightness signal like display data Pic, and a synchronization signal Sync from the supplied video signal Image. The display signal generating circuit 12 supplies the acquired display data Pic and synchronization signal Sync to the system controller 13.

The system controller 13 controls a correcting process of the display data Pic, a write-in operation, and a light emitting operation based on the display data Pic and the synchronization signal Sync both supplied from the display signal generating circuit 12.

The correcting process of the display data Pic is a process of generating a gradation signal corrected from the display data Pic supplied from the display signal generating circuit 12 based on a threshold voltage Vth of the drive transistor (transistor T1) of each pixel circuit $11(i, j)$ or a current amplification factor β thereof.

The write-in operation is an operation of writing a voltage corresponding to a gradation signal generated at the capacitor Cs of each pixel circuit $11(i,j)$.

The light emitting operation is an operation of supplying a current corresponding to a voltage held at the capacitor Cs to the organic EL device OEL, and of causing the organic EL device OEL to emit light.

In order to perform such control, the system controller 13 generates various control signals, supplies such signals to the select driver 14, the power source driver 15, and the data driver 16, and also supplies the generated gradation signal to the data driver 16.

The select driver 14 is a driver which successively selects rows of the light emitting panel 11, and comprises, for example, a shift resistor. The select driver 14 is connected to respective gates of the transistors T1, T2 of individual pixel circuits $11(i, j)$ through respective select lines Ls(j) (where j=1 to n).

The select driver 14 successively outputs, based on a control signal supplied from the system controller 13, select signals Vselect(j) of Hi level to from the first row pixel circuits $11(1, 1)$ to $11(m, 1)$ to n-th row pixel circuits $11(1, n)$ to $11(m, n)$, thereby successively selecting the rows of the TFT panel 11.

The power source driver 15 outputs signals Vsource(1) to Vsource(n) with a voltage VL or with a voltage VH to respective anode lines La(j) (where j=1 to n). The power source driver 15 is connected to respective drains of the transistors T1 of individual pixel circuits $11(i, j)$ through respective anode lines La(j).

The data driver 16 applies voltage signals Sv(1) to Sv(m) to individual data lines Ld(1) to Ld(m) based on the gradation signal supplied from the system controller 13.

Next, an explanation will be given of a physical structure of the light emitting panel 11 produced by the application device of the present invention.

Figure 7:
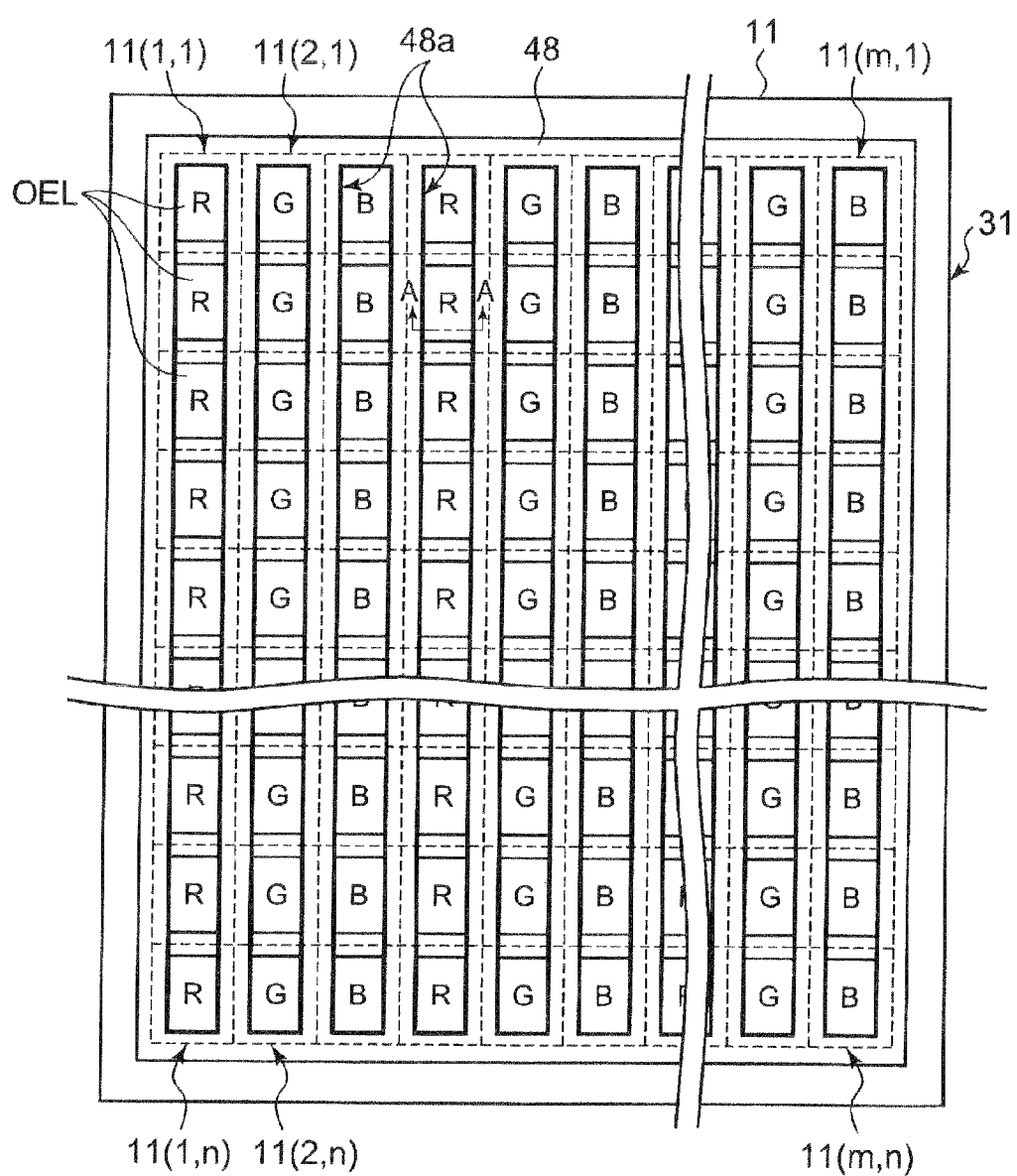
FIG. 7 is a schematic diagram showing an illustrative structure of a light emitting panel produced by the application device of the present invention.

FIG. 7 is a schematic diagram showing an illustrative structure of the light emitting panel produced by the application device of the present invention.

The light emitting panel 11 includes a substrate 31 having plural pixel circuits $11(i, j)$ arranged on one-side surface thereof. The substrate 31 is formed by dividing a large substrate including plural pieces of substrates 31 into each piece.

As shown in FIG. 7, formed on the one-side surface of the substrate 31 in a matrix pattern are plural pixel circuits $11(i, j)$ (where i=1 to m, and j=1 to n) each having the organic EL device OEL with any color of red (R), green (G), or blue (B). Plural pixel circuits $11(i, j)$ having the same color of organic EL devices are arranged in the column direction, and plural pixel electrodes $11(i, j)$ having the organic EL device OEL with luminescent color of red (R), green (G), and blue (B) are respectively arranged in series in the row direction.

As shown in FIG. 7, formed on the one-side surface of the substrate 31 are plural partition walls 48 for partitioning areas where the organic EL devices OEL of respective pixel circuits $11(i, j)$ are formed. Plural openings 48a each surrounded by the partition wall 48 which partitions the area where the organic EL device OEL of each pixel circuit $11(i, j)$ are formed between adjoining partition walls 48. The area inwardly of each opening 48a is the area where the organic EL device OEL of each pixel circuit $11(i, j)$ is formed. Each opening 48a is provided in the column direction in a stripe-like manner for example, and is provided across respective areas where plural organic EL devices of respective pixel circuits $11(i,j)$ which are arranged in the column direction are formed.

Note that the partition wall 48 may be provided in a reticular pattern so as to correspond to each pixel circuit $11(i, j)$ and each of the plurality of openings 48a may be formed so as to correspond to an area where one organic EL device OEL of pixel circuit $11(i, j)$ is formed.

As will be discussed later, formed between the one-side surface of the substrate 31 and the bottom surface of the partition wall 48 are various transistors, various capacitors, and various wirings in each pixel circuit $11(i, j)$.

Figure 8:
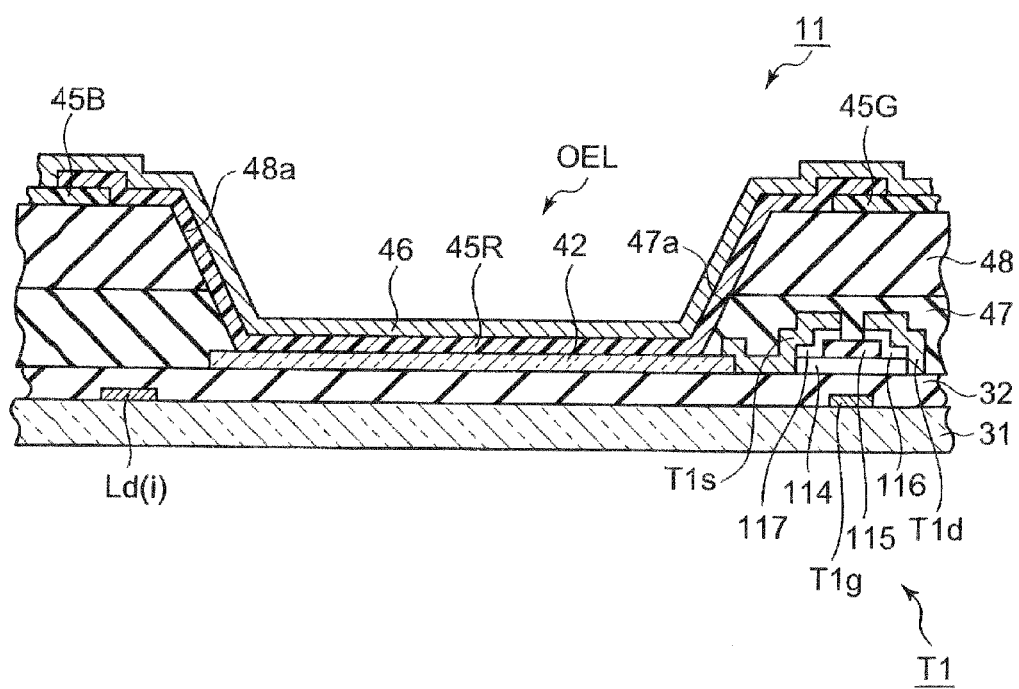
FIG. 8 is a cross-sectional view along a line A-A in FIG. 7.

Next. FIG. 8 is a cross-sectional view along a line A-A in FIG. 7, and showing the cross-sectional shape of the proximity of the area where the organic EL device OEL is formed and partitioned by the partition wall 48.

As shown in FIG. 8, the light emitting panel 11 includes a pixel electrode (anode electrode) 42, a light emission layer 45 (45R), and an opposing electrode (cathode electrode) 46 provided at the area where the organic EL device OEL is formed.

Note that 45R stands for a light emission layer with red luminescent color, and 45B, 45G each stands for a part of the light emission layer of the pixel circuit $11(i, j)$ with blue or green luminescent color formed adjacent to each other.

In the present embodiment, for ease of understanding, a structure having only the light emission layer 45 which is an organic EL layer (organic layer) contributing to light emission is explained, but the present invention is not to limited to such a structure, and the organic EL layer may include a hole-injecting layer and a light emission layer, or may include a hole-injecting layer, an interlayer, and a light emission layer.

The transistor T1 and a gate electrode T1g of the transistor T1 both formed by patterning a gate conductive layer are formed on the substrate 31 of each light emitting pixel. The data line Ld(i) formed by patterning the gate conductive layer and extending along the column direction is formed on the substrate 31 adjacent to each light emitting pixel.

The pixel electrode 42 is formed of a transparent conductive material, such as ITO (Indium Tin Oxide), or ZnO. The pixel electrode 42 is electrically insulated from the pixel electrode 42 of adjoining another pixel circuit 11(i, j) via an interlayer insulating film 47.

The interlayer insulating film 47 is formed of an insulating material, e.g., a silicon nitride film. The interlayer insulating film 47 is formed between pixel electrodes 42 of respective pixel circuits 11(i, j), and insulates/protects the transistors T1, T2, the select line Ls(j), and the anode line La(j).

A plurality of substantially rectangular openings 47a are formed in the interlayer insulating film 47, and the area where the organic EL device OEL of each pixel circuit 11(i, j) is formed is segmented by each opening 47a.

As shown in FIG. 8, the partition wall 48 is formed on the interlayer insulating film 47. The plurality of openings 48a each in a groove-like shape communicating with the opening 47a of the interlayer insulating film 47 are formed in the partition wall 48. The partition wall 48 is formed of a hardened photosensitive resin like polyimide.

The partition wall 48 extends in, for example, the column direction, and is formed in a stripe-like pattern. In this case, the openings 48a of the partition wall 48 are formed across a plurality of areas where respective organic EL devices OEL of plural pixel circuits 11(1, j) are formed in the column direction.

Note that a water-repellent treatment may be performed on the surface of the partition wall 48 and that of the interlayer insulating film 47 so that such surfaces have water repellent property. Note that a condition having water repellent property means a condition having repellent property against both water solvent and organic solvent in a liquid for forming the light emission layer 45.

The light emission layer 45 is formed on the pixel electrode 42. The light emission layer 45 has a function of emitting light as a voltage is applied across the anode electrode 42 to the opposing electrode 46.

The light emission layer 45 is formed of a conventionally-well-known polymer light emitting material which can emit fluorescent light or phosphorescent light, e.g., light emitting material including poly-p-phenylenevinylene or polyfluorine conjugated double-bonded polymer.

Such light emitting material can be formed by applying a liquid (a dispersion liquid) dissolved (or dispersed) in a water solvent or an organic solvent, such as tetralin, tetramethylbenzene, mesitylene, or xylene, through a nozzle printing scheme or an ink jet scheme, by causing the solvent to volatilize through a heating process or the like, and by drying the volatilized solvent.

When the hole-injecting layer is provided as an organic EL layer, the hole-injecting layer is provided between the pixel electrode 42 and the light emission layer 45. The hole-injecting layer has a function of supplying holes to the light emission layer 45. The hole-injecting layer is formed of an organic polymer material which accepts injection/transporting of holes, e.g., polyethylenedioxithiophene (PEDOT) which is conductive polymer and polystyrenesulfonic acid (PSS) which is dopant.

Furthermore, when an interlayer is provided, the interlayer is formed between the hole-injecting layer and the light emission layer 45. The interlayer has a function of suppressing any injection of holes from the light emission layer 45 to the hole-injecting layer 45, and of promoting recombination of electrons with holes in the light emission layer 45, thereby enhancing the light efficiency of the light emission layer 45.

In the case of the bottom-emission type, the opposing electrode 46 has a stacked-layer structure having an electron-injecting lower layer formed of a conductive material with a low work function, such as Li, Mg, Cu, or Ba, and provided at the light emission layer 45 side, and an upper layer formed of a light reflective conductive metal like Al and provided on the lower layer.

In the present embodiment, the opposing electrode 46 comprises a single electrode layer formed across the plural light emitting pixels, and a common voltage Vss which is a ground voltage for example is applied thereto.

In a case in which the organic EL device OEL is the top-emission type, the opposing electrode 46 employs a transparent stacked structure having a light transmissive low-work-function layer provided at the light emission layer 45 side and formed of an extremely thin material like 10 nm or so having a low work function, such as Li, Mg, Ca, or Ba, and a light transmissive conductive layer, e.g., ITO, provided on the light transmissive low-work-function layer and having a thickness like 100 to 200 nm or so.

Next, an explanation will be given of the production method of the light emitting device 10 of the present embodiment.

Figure 9A:
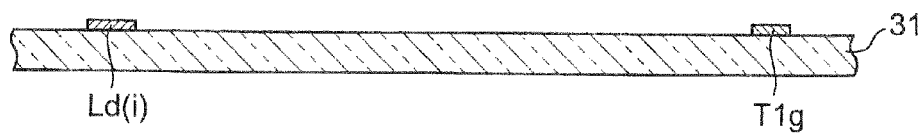
FIG. 9A is a diagram showing how to produce a light emitting device.
Figure 9B:
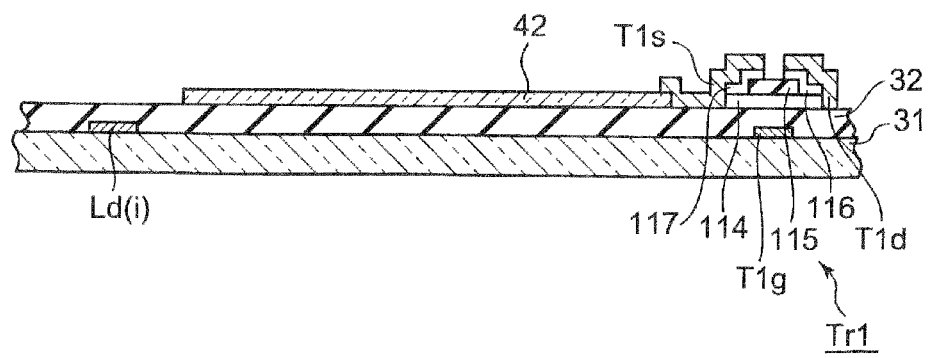
FIG. 9B is a diagram showing how to produce the light emitting device.
Figure 9C:
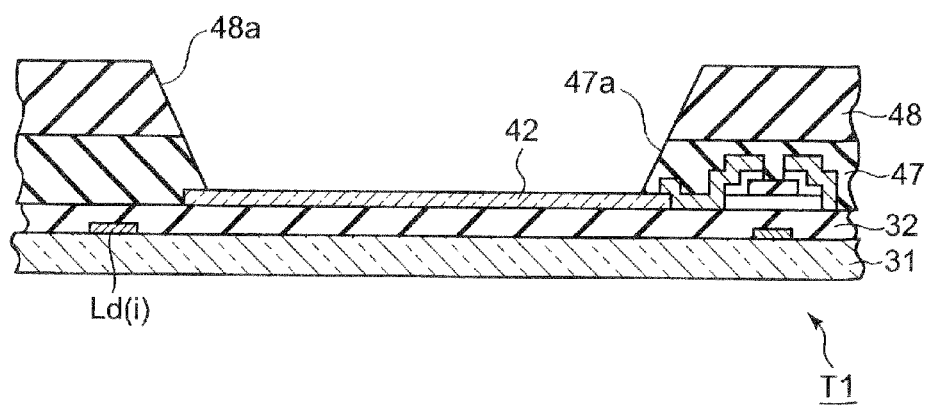
FIG. 9C is a diagram showing how to produce the light emitting device.

FIGS. 9A, 9B, and 9C are diagrams showing the production method of the light emitting device.

Because the transistor T2 shown in FIG. 6 is produced through the same process as that of the transistor T1, a part of formation process of the transistor T2 will be skipped.

As shown in FIG. 9A, first, a substrate 31 like a glass substrate is prepared.

Next, a gate conductive film, such as an Mo film, a Cr film, an Al film, a Cr/Al stacked-layer film, an AiTi alloy film, an AlNdTi alloy film, or an MoNb alloy film, is formed on the substrate 31 by sputtering, vacuum vapor deposition, etc.

As shown in FIG. 9A, the gate conductive film is patterned to the shape of the gate electrode T1g of the transistor T1 and that of the data line Ld(i). Accordingly, agate electrode 112 (T1g) and the data line Ld(i) are formed.

At this time, it is not illustrated in the figure but the gate electrode T2g of the transistor T2 is also formed simultaneously.

Subsequently, as shown in FIG. 9B, an insulating film 32 is formed on the gate electrode T1g and the data line Ld(i) by CVD (Chemical Vapor Deposition) or the like.

Next, a semiconductor layer 114 formed of amorphous silicon or the like is formed on the insulating film 32 by CVD or the like. Subsequently, an insulating film like SiN is formed on the semiconductor layer 114 by CVD or the like.

Next, the insulating film is patterned through, for example, photolithography or the like, thereby forming a stopper film 115.

Furthermore, a film of amorphous silicon or the like containing n-type dopants is formed on the semiconductor layer 114 and the stopper film 115 by CVD or the like, and this film and the semiconductor layer 114 are patterned through photolithography.

Accordingly, the semiconductor layer 114, ohmic contact layers 116, 117 shown in FIG. 9B are formed.

Next, a transparent conductive film like ITO, or, a light reflective conductive film and a transparent conductive film like ITO are formed on the insulating film 32 by sputtering, vacuum vapor deposition, etc., and patterning is performed thereon through photolithography, thereby forming the pixel electrode 42.

Subsequently, a contact hole which is a thorough-hole is formed in the insulating film 32, and a source/drain conductive film formed of, for example, an Mo film, a Cr film, an Al film, a Cr/Al stacked-layer film, an AlTi alloy film, an Al NdTi alloy film, or an MoNb alloy film is formed though sputtering, vacuum vapor deposition, etc. Such film is patterned through photolithography, thereby forming a drain electrode T1d and a source electrode T1s shown in FIG. 9B. While at the same time, the anode line La(j) is also formed. At this time, the source electrode T1s of the transistor is so formed as to partially overlap the pixel electrode 42.

Next, as shown in FIG. 9C, the interlayer insulating film 47 formed of, for example, silicon nitride is so formed as to cover the transistor T1 and the like through CVD or the like. Thereafter, the interlayer insulating film 47 is patterned through photolithography, and the opening 47a shown in FIG. 9C is formed.

Next, as shown in FIG. 9C, photosensitive polyimide is applied so as to cover the interlayer insulating film 47. The photosensitive polyimide is patterned by exposure and development through a mask corresponding to the shape of the partition wall 48, thereby forming the partition wall 48 with the opening 48a shown in FIG. 9C.

Next, an organic compound liquid containing light emitting polymers (R, G, B) is applied on the pixel electrode 42 which is provided inwardly of the opening 48a of the partition wall 48 and exposed inwardly of the opening 47a of the interlayer insulating film 47 using a later-described nozzle-printing type application device that continuously propels ink from a nozzle hole. The liquid application is performed in the column direction along the opening 48a of the partition wall 48.

First Embodiment

Next, an explanation will be given of a case in which the present invention is applied to a nozzle-printing type application device.

The present invention is suitably applicable to an ink-jet type application device, too.

Figure 10A:
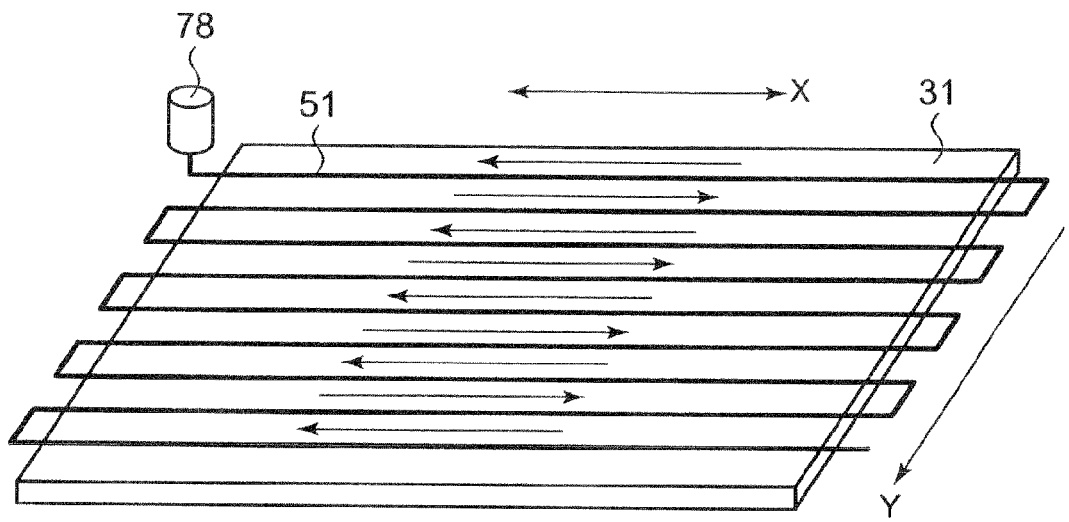
FIG. 10A is a diagram showing an outline of an application operation by a nozzle-printing type application device according to a first embodiment of the present invention.
Figure 10B:
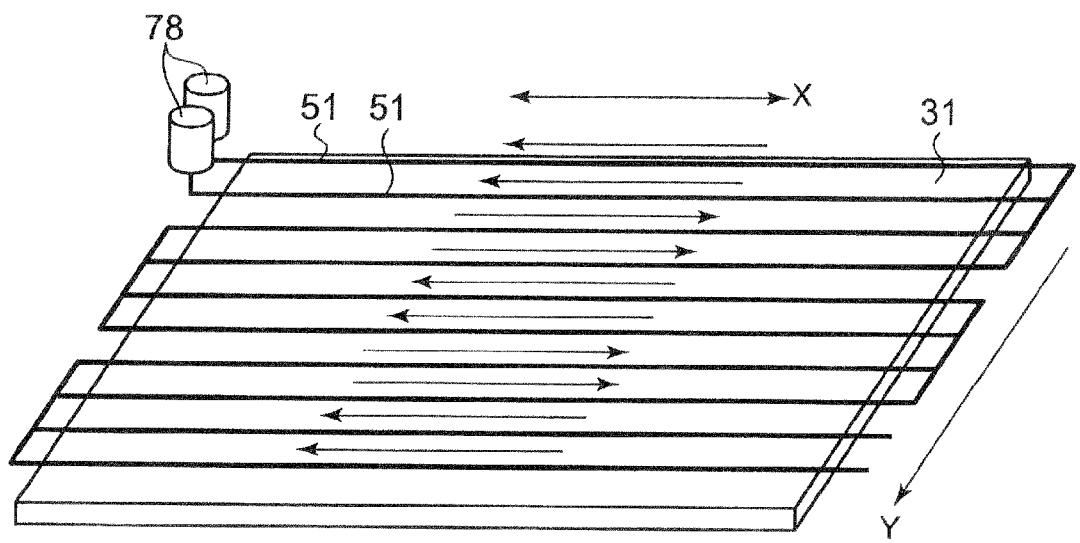
FIG. 10B is a diagram showing an outline of the application operation by the nozzle-printing type application device according to the first embodiment of the present invention.

FIGS. 10A, 10B are diagrams showing an outline of an application operation by a nozzle-printing type application device according to the first embodiment of the present invention.

As shown in FIGS. 10A, 10B, the nozzle-printing type application device generally comprises a nozzle head (discharge unit) 78 including a nozzle hole (discharge hole).

The nozzle-printing type application device discharges a liquid 51 which is an organic-compound containing liquid containing light emitting polymer materials (R, G, B) from the nozzle hole, and moves the nozzle head 78 on the substrate 31 relative to the substrate 31 to apply the organic-compound containing liquid to a predetermined region on the substrate 31. Next, the substrate 31 is heated in an atmosphere to cause the solvent in the liquid 51 to volatilize, thereby forming light emission layers (application layers) 45R, 45C, and 45B. Note that the liquid 51 may be applied under a heated atmosphere.

The X direction in FIGS. 10A, 10B corresponds to the column direction of the substrate 31 shown in FIG. 7, and the Y direction corresponds to the row direction.

The nozzle-printing type application device moves the nozzle head 78 along the column direction in which the partition wall 48 extends while discharging the liquid 51 in the opening 48a of the partition wall 48 from the nozzle head 78, thereby applying the liquid 51 in the opening 48a of the partition wall 48.

When the organic compound containing liquid is successively applied in the plural rows of openings 48a, as shown in FIG. 10A, the nozzle-printing type application device moves the nozzle head 78 in a direction corresponding to the row direction of the substrate 31 while the nozzle head 78 is being out of the substrate 31. Note that the liquid 51 may be continuously discharged from the nozzle head 78 while the nozzle head 78 is being out of the substrate 31.

Note that FIG. 10A shows a general structure of the application device which includes one nozzle head 78 and applies the liquid 51 one column by one column, but the present invention is not limited to this structure. The nozzle-printing type application device may employ a structure having equal to two or greater nozzle heads 78 to apply the liquid 51 to corresponding plural columns simultaneously.

FIG. 10B shows a general structure of an application device which has two nozzle heads 78 and applies the liquid 51 to two columns simultaneously. In this case, the operation is basically same as that shown in FIG. 10A except that the travel distance of the substrate 31 while the nozzle heads 78 are being out of the substrate 31 in the row direction becomes twice.

In a case in which the hole-injecting layer is to be formed, before the light emission layer 45 is formed, a liquid 51 containing hole-injecting materials is selectively applied on the pixel electrode 42 surrounded by the opening 47a using a nozzle-printing type application device which allows the liquid 51 to successively flow out or an ink-jet type application device which discharges the liquid 51 as plural droplets each independent from one another. Next, the substrate 31 is heated in an atmosphere to cause the solvent in the liquid 51 to volatilize, thereby forming the hole-injecting layer (application layer). The liquid 51 may be applied under a heated atmosphere.

Furthermore, in a case in which the interlayer is to be formed, a liquid 51 containing materials for the interlayer is applied on the hole-injecting layer using a nozzle-printing type or ink-jet type application device. The substrate 31 is heated and dried under a nitrogen atmosphere, or heated and dried in a vacuum condition to eliminate residual solvent, thereby forming the interlayer (application layer). The liquid 51 may be applied under a heated atmosphere.

Next, the opposing electrode 46 employing the two-layer structure of a layer formed of a material with a low work function, such as Li, Mg, Ca, or Ba, and a light reflective conductive layer like Al on the substrate 31 having layers formed so far up to the light emission layer 45 through vacuum vapor deposition or sputtering.

Next, an encapsulation resin formed of an ultraviolet curing resin or a thermoset resin is applied on the substrate 31 outwardly of a light emission region where plural light emitting pixels are formed, and a non-illustrated encapsulation substrate and the substrate 31 are bonded together. Next, the encapsulation resin is hardened by ultraviolet or heat, thereby joining the substrate 31 and the encapsulation substrate together.

Next, an explanation will be given of a specific structure of the nozzle-printing type application device (nozzle printer) according to the present embodiment.

Figure 11:
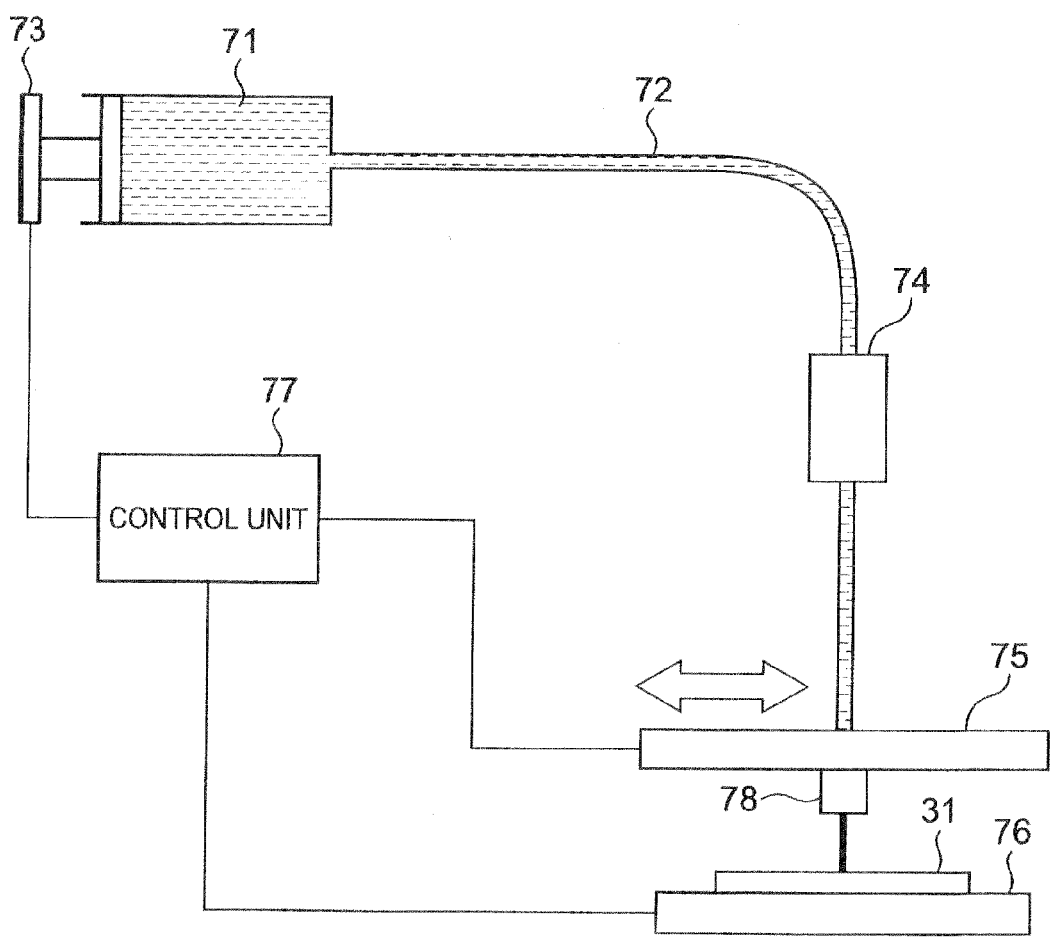
FIG. 11 is a diagram showing a whole specific structure of the nozzle-printing type application device.

FIG. 11 is a diagram showing a specific structure, as a whole, of the application device according to the present embodiment.

The application device includes a liquid tank 71, a supply pipe 72, a pressurizing unit 73, a flow-rate detecting/controlling unit 74, a linear driving unit 75, a stage 76, a control unit 77, and a nozzle head 78. The linear driving unit 75 and the stage 76 configure a moving unit of the present invention.

The liquid tank 71 is for retaining the liquid 51 like an organic-compound containing liquid to be applied.

The supply pipe 72 is for introducing the liquid retained in the liquid tank 71 to the nozzle head 78, and is formed of a flexible material.

The pressurizing unit 73 is for applying pressure to the liquid retained in the liquid tank 71.

The flow-rate detecting/controlling unit 74 controls the pressure of the liquid and the flow rate thereof so that a constant amount of liquid can be discharged from the nozzle head 78, and is attached around the supply pipe 72. The flow-rate detecting/controlling unit 74 comprises, for example, a mass-flow controller.

The linear driving unit 75 is for causing the nozzle head 78 to scan (move) in the horizontal direction (X direction: this direction is defined as a main scanning direction) in FIGS. 10A, 10B. The main scanning direction corresponds to the column direction of the substrate 31.

The stage 76 is for fixing the substrate 31, and is movable in the Y direction (this direction is defined as a sub scanning direction) in FIGS. 10A, 10B. The sub scanning direction corresponds to the row direction of the substrate 31.

The control unit 77 controls the whole application device to apply the liquid to the substrate 31. The control unit 77 actuates the linear driving unit 75 to move the nozzle head 78 in the main scanning direction relative to the substrate 31, and applies the liquid in the column direction by what corresponds to one line, and moves the stage 76 in a stepping manner to move the substrate 31 in the sub scanning direction by one column.

The control unit 77 successively performs such controlling, and applies the liquid to all lines of the substrate 31.

The present invention is not limited to this structure, and for example, the substrate 31 may be moved in the main scanning direction and the sub scanning direction while the nozzle head 78 is being fixed, or the nozzle head 78 may be moved in the main scanning direction and the sub scanning direction while the position of the substrate 31 is being fixed. Alternatively, the nozzle head 78 may be moved in the sub scanning direction, and the substrate 31 may be moved in the main scanning direction.

That is, it is appropriate if a structure that the nozzle head 78 is moved relative to the substrate 31 in the main scanning direction and in the sub scanning direction is employed.

Figure 12:
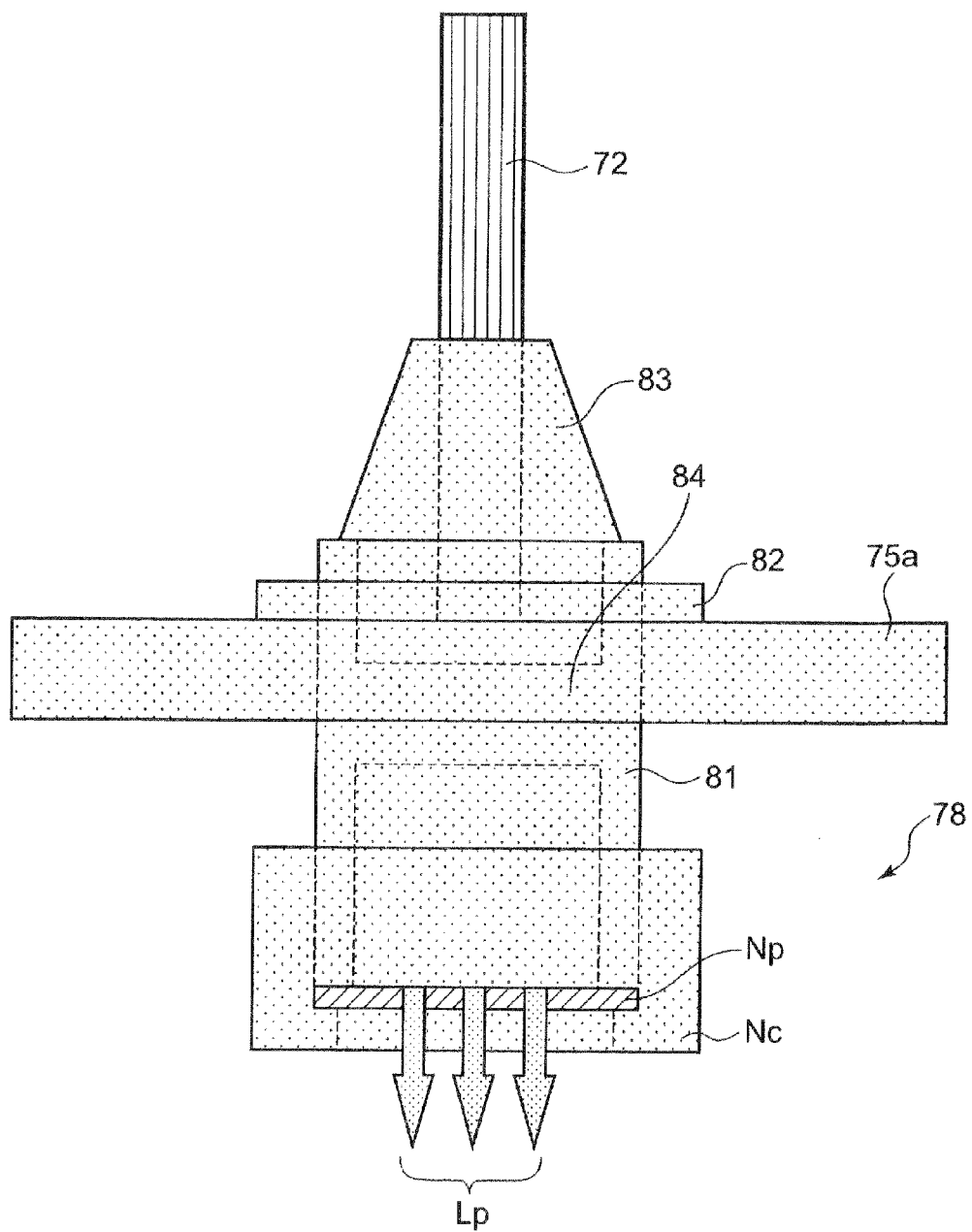
FIG. 12 is a diagram showing a structure of a nozzle head shown in FIG. 11.
Figure 13:
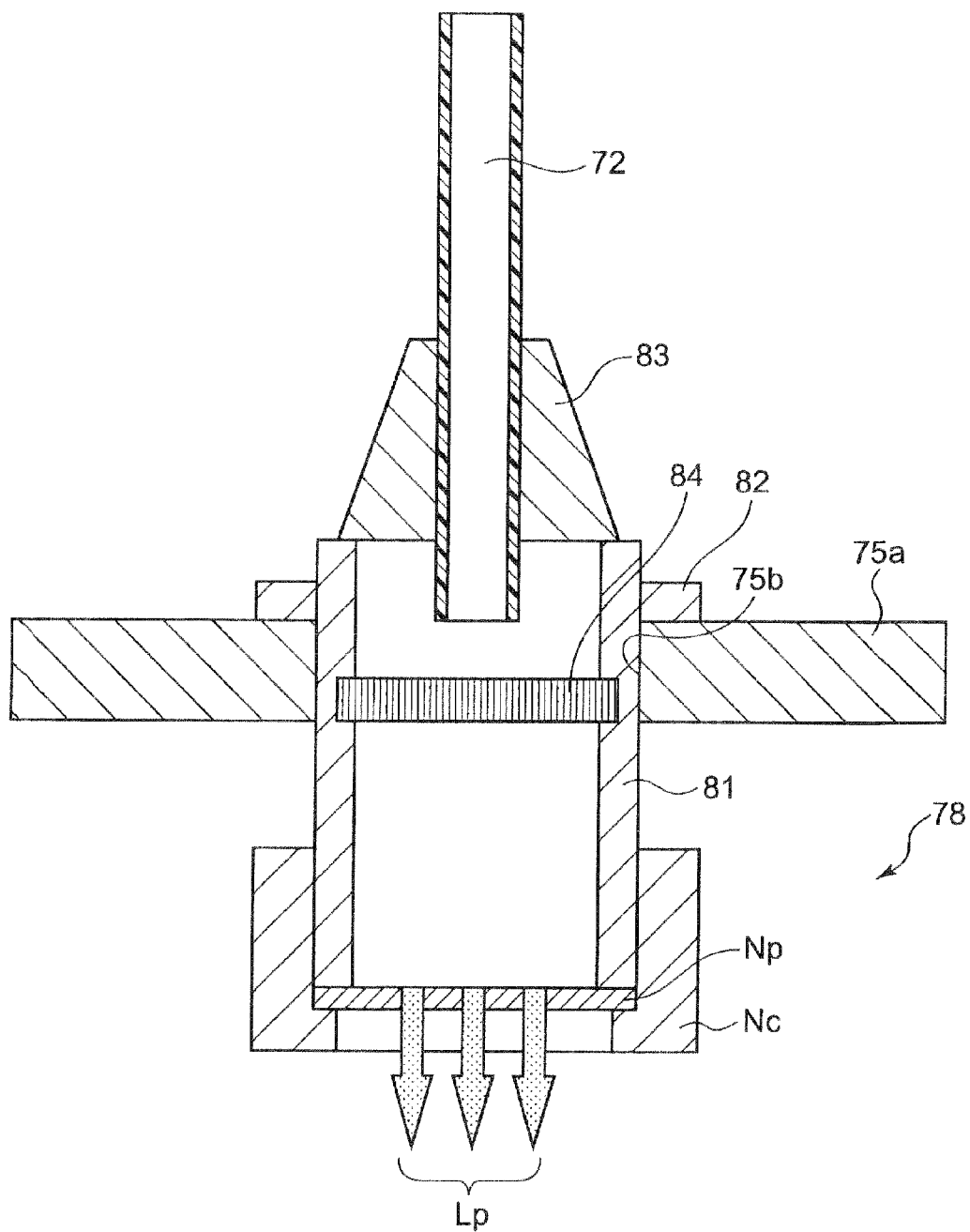
FIG. 13 is a cross-sectional view of the nozzle head shown in FIG. 11.

FIG. 12 is a diagram showing a specific illustrative structure of the nozzle head 78 shown in FIG. 11, and FIG. 13 is a cross-sectional view of the nozzle head 78.

The nozzle head 78 is a mechanism which discharges the liquid, and is attached to the linear driving unit 75.

As shown in FIGS. 12 and 13, the nozzle head 78 comprises a head cylinder 81, a cylinder flange 82, a coupling unit 83, a filter 84, a nozzle plate Np, and a nozzle cap Nc.

The head cylinder 81 is a main body of the nozzle head 78, and has an interior filled with the liquid introduced by the supply pipe 72.

The cylinder flange 82 is a flange, and is provided around the outer circumference of the head cylinder 81. The cylinder flange 82 is integrally formed with the head cylinder 81 or joined together with the head cylinder 81.

A base unit 75a is a part which configures the scanning unit of the liner driving unit 75 of the application device, and is provided with an opening 75b for attaching the nozzle head 78 therein. The head cylinder 81 is inserted into this opening 75b, and the cylinder flange 82 is fixed to the base unit 75a by means of screws.

The coupling unit 83 couples the leading end of the supply pipe 72 and the head cylinder 81 together.

The filter 84 is for filtrating the liquid supplied to the nozzle head 78, and is fixed inside the head cylinder 81.

The nozzle plate Np is for discharging the liquid, and is provided with plural nozzle holes where the liquid is discharged. As the pressurizing unit 73 applies pressure inside the piping, the liquid discharged from individual nozzle hole of the nozzle plate Np becomes a liquid column Lp.

The nozzle cap Nc is for fixing and arranging the nozzle plate Np at one side of the head cylinder 81. The nozzle plate Np is fixed at one side of the head cylinder 81 by the nozzle cap Nc, and as the nozzle cap Nc is detached, replacement of the nozzle plate Np is enabled.

The nozzle plate Np of the present embodiment is a multi nozzle plate having plural nozzle holes with the same diameter, and the liquid is supplied from a single liquid tank 71 in a manner of single hydraulic system.

Figure 14A:
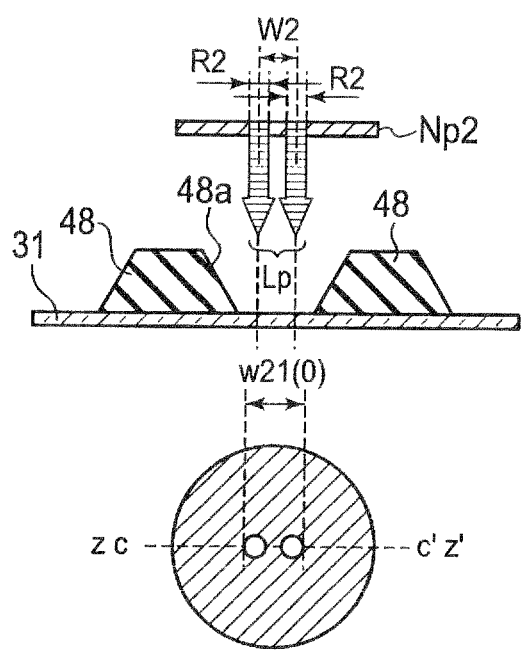
FIG. 14A is a diagram showing a twin nozzle plate which is a nozzle plate for the nozzle-printing type application device according to the first embodiment of the present invention.
Figure 14B:
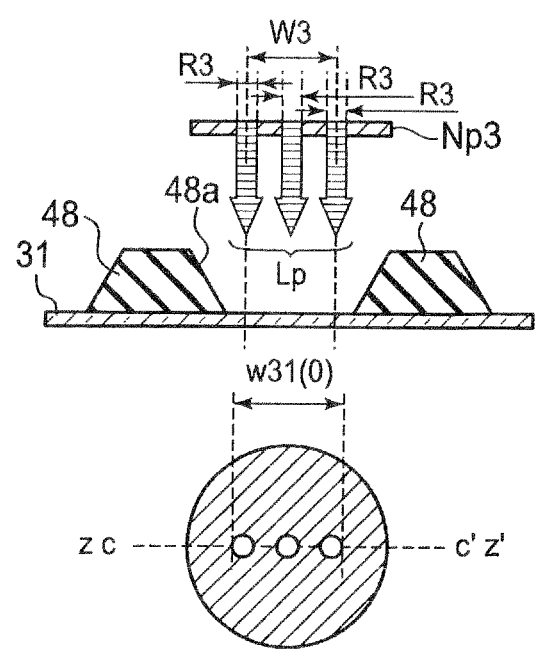
FIG. 14B is a diagram showing a triple nozzle plate which is a nozzle plate for the nozzle-printing type application device according to the first embodiment of the present invention.

FIGS. 14A and 14B are diagrams showing respective examples of the multi nozzle plate Np according to the first embodiment. FIG. 14A shows a twin nozzle plate Np2 having two nozzle holes as the above-explained plural nozzle holes. FIG. 14B shows a triple nozzle plate Np3 having three nozzle holes.

Each nozzle hole of the twin nozzle plate Np2 and each nozzle hole of the triple nozzle plate Np3 has the same or substantially same diameter, which is 10 to 20 μm or so. Individual nozzle holes are provided around the center point of the twin nozzle plate Np2 or of the triple nozzle plate Np3. In the case of the triple nozzle plate Np3, the three nozzle holes are so formed as to be arranged side by side on a straight line.

When a center line passing through the center of each nozzle hole is c-c' and the sub scanning direction is z-z', in the first embodiment, the twin nozzle plate Np2 and the triple nozzle plate Np3 are set in the nozzle head 78 shown in FIG. 11 so that the center line c-c' matches the sub scanning direction z-z'.

In the case of the twin nozzle plate Np2, when the clearance between respective centers of two nozzle holes and the diameter of each nozzle hole are W2, and R2, respectively, if an application width of the liquid applied from the twin nozzle plate Np2 is w21(0), then the application width w21(0) can be expressed through the following equation (1).

$$w21(0) = W2 + R2 \qquad \text{[Equation 1]}$$

In the case of the triple nozzle plate Np3, when the clearance between respective centers of the nozzle holes at both sides and the diameter of each nozzle hole are W3, R3, respectively, if an application width of the liquid applied from the triple nozzle plate Np3 is w31(0), then the application width w31(0) can be expressed through the following equation (2).

$$w31(0) = W3 + R3 \qquad \text{[Equation 2]}$$

In the first embodiment, it is assumed that a liquid column Lp is formed by a nozzle plate Np having one nozzle hole and a discharge condition which enables uniform application is set beforehand.

When the application width is changed to be about twice, the discharge condition is unchanged, but the nozzle plate Np is replaced with the twin nozzle plate Np2 shown in FIG. 14A. Accordingly, the twice application width w21(0) can be stably accomplished.

When the application width is changed to be about triple, the discharge condition is unchanged, but the nozzle plate is changed to the triple nozzle plate Np3 shown in FIG. 14B. Accordingly, the triple application width w31(0) can be stably accomplished.

In this fashion, when the application width is changed, uniform film formation is enabled by merely changing a nozzle plate to an appropriate nozzle plate without needing re-adjustment of the discharge condition.

In the case of the twin nozzle plate Np2 shown in FIG. 14A, and in the case of the triple nozzle plate Np3 shown in FIG. 14B, as respective clearances W2, W3 are adjusted in accordance with the clearance between adjoining partition walls 48, i.e., the width of the opening 48a, an appropriate application width can be acquired in between adjoining partition walls 48.

As explained above, according to the first embodiment, plural nozzle holes are formed in the nozzle plate Np, a liquid is supplied from a single-system liquid tank 71 to form multiple liquid columns.

Therefore, it is possible to apply the liquid uniformly without increasing liquid pressure and increasing the eject speed of the liquid column Lp, and to reduce any occurrence of application unevenness even if the application width is changed. Moreover, it is possible to suppress any color mixing which occurs when the liquid goes over the partition wall.

The application width of the liquid can be adjusted by changing the clearance between respective center points of plural nozzle holes of the nozzle plate Np, the nozzle diameter of each nozzle hole, and the number of nozzle holes.

Therefore, it is possible to accomplish application widths appropriate for respective plural kinds of panels having different pixel resolutions and different pixel sizes by selecting an appropriate nozzle plate Np corresponding to each kind of panel and by replacing the present nozzle plate to the selected nozzle plate without changing the discharge condition.

That is, in a case in which plural kinds of substrates having different specifications, e.g., a relatively-small substrate having an application-target region with a relatively-narrow application width and having a high pixel definition and a relatively-small pixel size, and a relatively-large substrate for a large-sized screen TV or the like having an application-target region with a relatively-wide application width and having a low pixel definition and relatively-large pixel size are subjected to application using an application device including a conventional nozzle head with only one nozzle hole, the optimum application condition differs for both cases. Accordingly, stable application to one substrate is difficult through an application condition which enables stable application to another substrate, and it is necessary to re-adjust the application condition for each substrate having a different specification.

In contrast, according to the present embodiment, it becomes possible to stably apply the liquid to the application-target region of each substrate by merely selecting a nozzle plate appropriate for each substrate and replacing the nozzle plate to the appropriate one without needing re-adjustment of other application conditions including the discharge condition.

Second Embodiment

An application device according to the second embodiment comprises the nozzle head 78 which further includes, in comparison with the application device of the first embodiment, a rotation mechanism that rotates a multi nozzle plate.

That is, a multi nozzle plate of the second embodiment is configured to rotate on a plane including the main scanning direction and the sub scanning direction in the nozzle head 78.

Figure 15A:
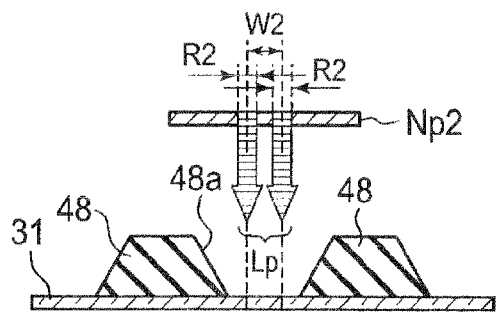
FIG. 15A is a diagram showing a rotatable double nozzle plate which is a nozzle plate for a nozzle-printing type application device according to a second embodiment of the present invention.
Figure 15A:
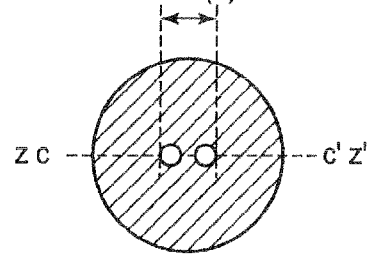
Figure 15A:
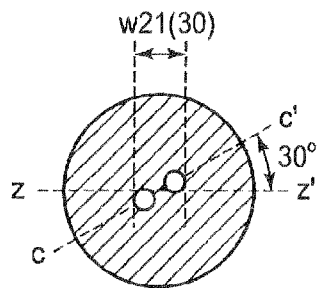
Figure 15A:
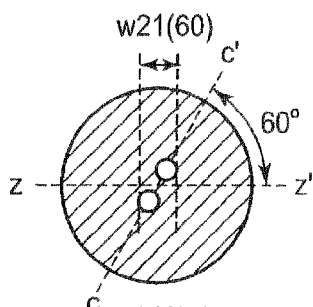
Figure 15A:
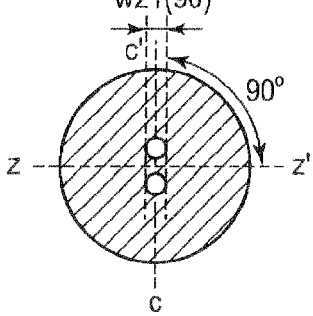
Figure 15B:
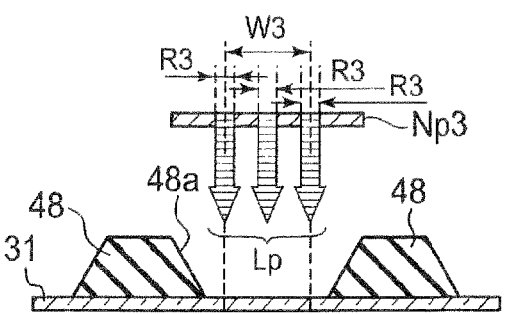
FIG. 15B is a diagram showing a triple nozzle plate which is a nozzle plate for the nozzle-printing type application device according to the second embodiment of the present invention.
Figure 15B:
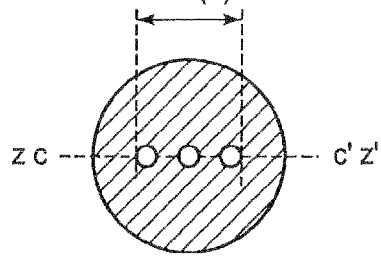
Figure 15B:
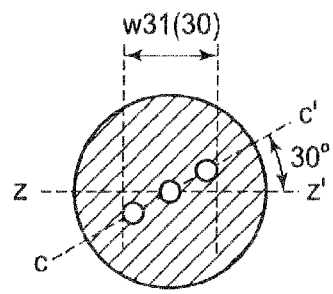
Figure 15B:
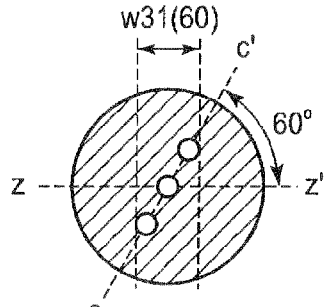
Figure 15B:
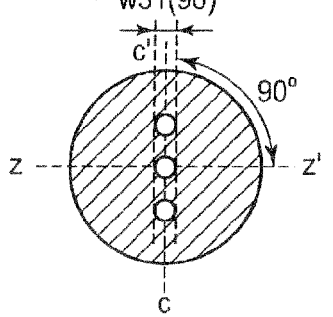

FIGS. 15A, 15B are diagrams showing a double nozzle plate and a triple nozzle plate, respectively, which are rotatable according to the second embodiment.

In the case of a double nozzle plate Np2, as shown in FIG. 15A, the double nozzle plate Np2 is rotated and fixed in such a way that an angle of a center line c-c' relative to the sub scanning direction z-z' becomes 0 to 90 degree.

If application widths when the angle is set to 0, 30, 60, and 90 degree are w21(0), w21(30), w21(60), and w21(90), respectively, respective application widths take values in following equations (3) to (5), and $w21(0)>w21(30)>w21(60)>w21(90)$ is satisfied.

$$w21(30)=w21(0)\times 4/5 \quad \text{[Equation 3]}$$

$$w21(60)=w21(0)\times 3/5 \quad \text{[Equation 4]}$$

$$w21(90)=R2 \quad \text{[Equation 5]}$$

The same is true of the triple nozzle plate Np3 which is configured to rotate on a plane including the main scanning direction and the sub scanning direction. The triple nozzle plate Np3 is rotated and fixed in such a way that an angle of the center line c-c' relative to the sub scanning direction z-z' becomes 0 to 90 degree.

If application widths when the angle is set to 0, 30, 60, and 90 degree, are w31(0), w31(30), w31(60), and w31(90), respectively, respective application widths take values in following equations (6) to (8), and $w31(0)>w31(30)>w31(60)>w31(90)$ is satisfied.

$$w31(30)=w31(0)\times 4/5 \quad \text{[Equation 6]}$$

$$w31(60)=w31(0)\times 3/5 \quad \text{[Equation 7]}$$

$$w31(90)=R3 \quad \text{[Equation 8]}$$

If an application width does not match a clearance between adjoining partition walls, i.e., the width of the opening 48a, an applied liquid may go over the partition wall, and may stick out to adjoining another application-target area.

In contrast, according to the second embodiment, as the nozzle plate Np2 with two nozzles and the nozzle plate Np3 with three nozzles are configured to rotate at an arbitrary rotational angle, the application width can be adjusted finely. This fine adjustment enables setting of an application width to appropriate value for individual various panels. Therefore, it is possible to suppress any stick out of an applied liquid to adjoining another application-target area.

Furthermore, according to the second embodiment, even if an application width is changed, the number of nozzle holes of multi nozzle plate and the size of nozzle hole remain same. Accordingly, it is unnecessary to change the discharge condition at all when an application width is changed, and a desired application width can be stably accomplished.

Next, an explanation will be given of an illustrative mechanism which makes the multi nozzle plate in the nozzle head 78 rotatable.

FIGS. 16A, 16B to FIG. 19 are diagrams showing a first illustrative structure of the nozzle head 78 with a rotating mechanism, and FIGS. 20A to 20C are diagrams showing a second illustrative structure of the nozzle head 78 with a rotating mechanism.

The nozzle head 78 with a rotating mechanism which makes the multi nozzle plate (in this example, the triple nozzle plate Np3) rotatable employs, for example, the first structure shown in FIGS. 16A, 16B to FIG. 19, and the second structure shown in FIGS. 20A to 20C. In this example, the explanation will be given of a case in which the triple nozzle plate Np3 is used as the multi nozzle plate, but the double nozzle plate may be used instead as the multi nozzle plate.

Figure 16A:
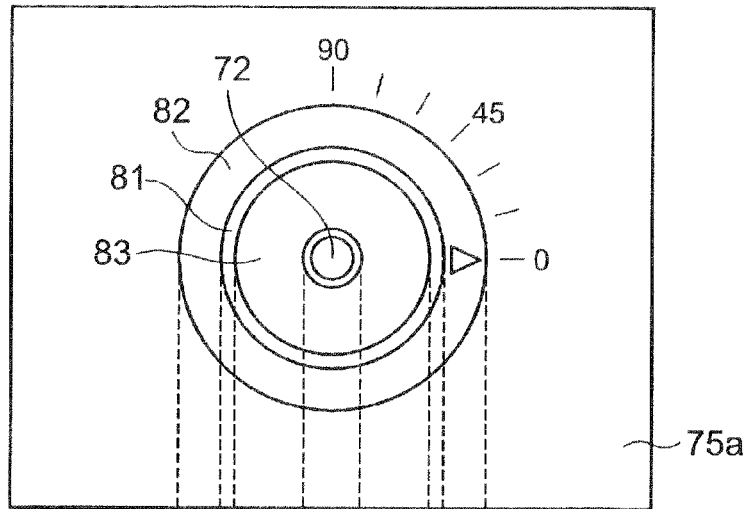
FIG. 16A is a diagram showing an illustrative structure (1) of a nozzle head having a rotating mechanism.
Figure 16B:
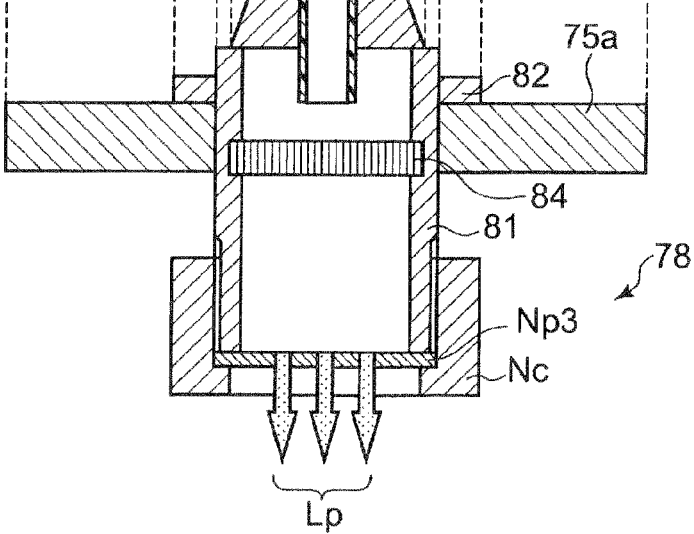
FIG. 16B is a diagram showing the illustrative structure (1) of the nozzle head having the rotating mechanism.

As shown in FIGS. 16A, 16B, according to the first illustrative structure, the rotational angle of the head cylinder 81 can be adjusted to an arbitrary angle relative to the base unit 75a and the head cylinder 81 can be fixed at an adjusted rotational angle. That is, the head cylinder 81 is rotatable at an arbitrary angle relative to the base unit 75a, and can be fixed to the base unit 75a at an arbitrary rotational angle. The head cylinder 81 corresponds to a rotating mechanism.

Note that FIG. 16A is a top plan view of the nozzle head 78, and FIG. 16B is a side view thereof.

Figure 17A:
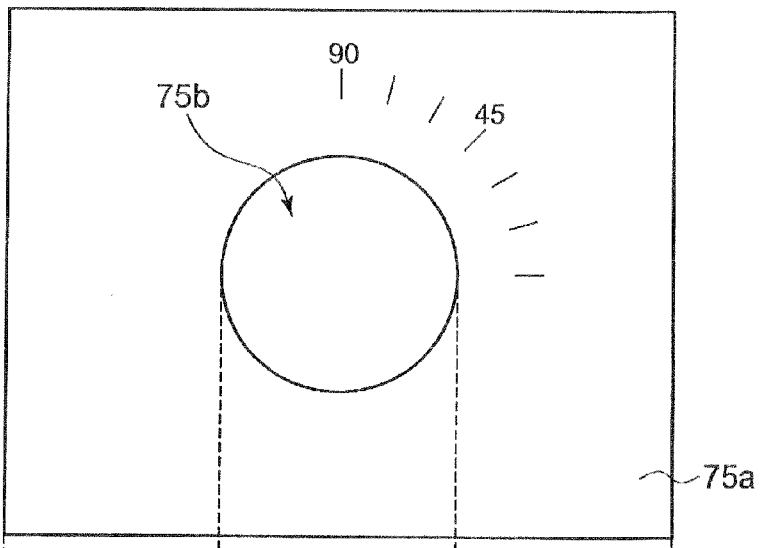
FIG. 17A is a diagram showing a base unit which configures the rotating mechanism shown in FIGS. 16A and 16B.
Figure 17B:
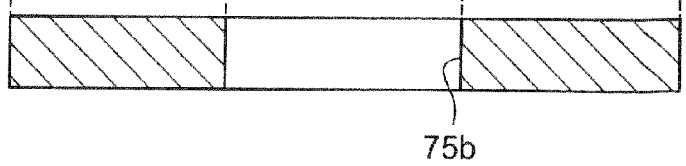
FIG. 17B is a diagram showing the base unit which configures the rotating mechanism shown in FIGS. 16A and 16B.

As shown in FIGS. 17A, 17B, the opening 75b is provided in the center of the base unit 75a, and the base unit 75a has marks each of which indicates an angle of the center line c-c' relative to the sub scanning direction z-z' of the nozzle head 78 and which is put in the top surface of the base unit 75a.

As shown in FIG. 16A, a triangular mark is put in the cylinder flange 82 for angle adjustment.

Figure 18:
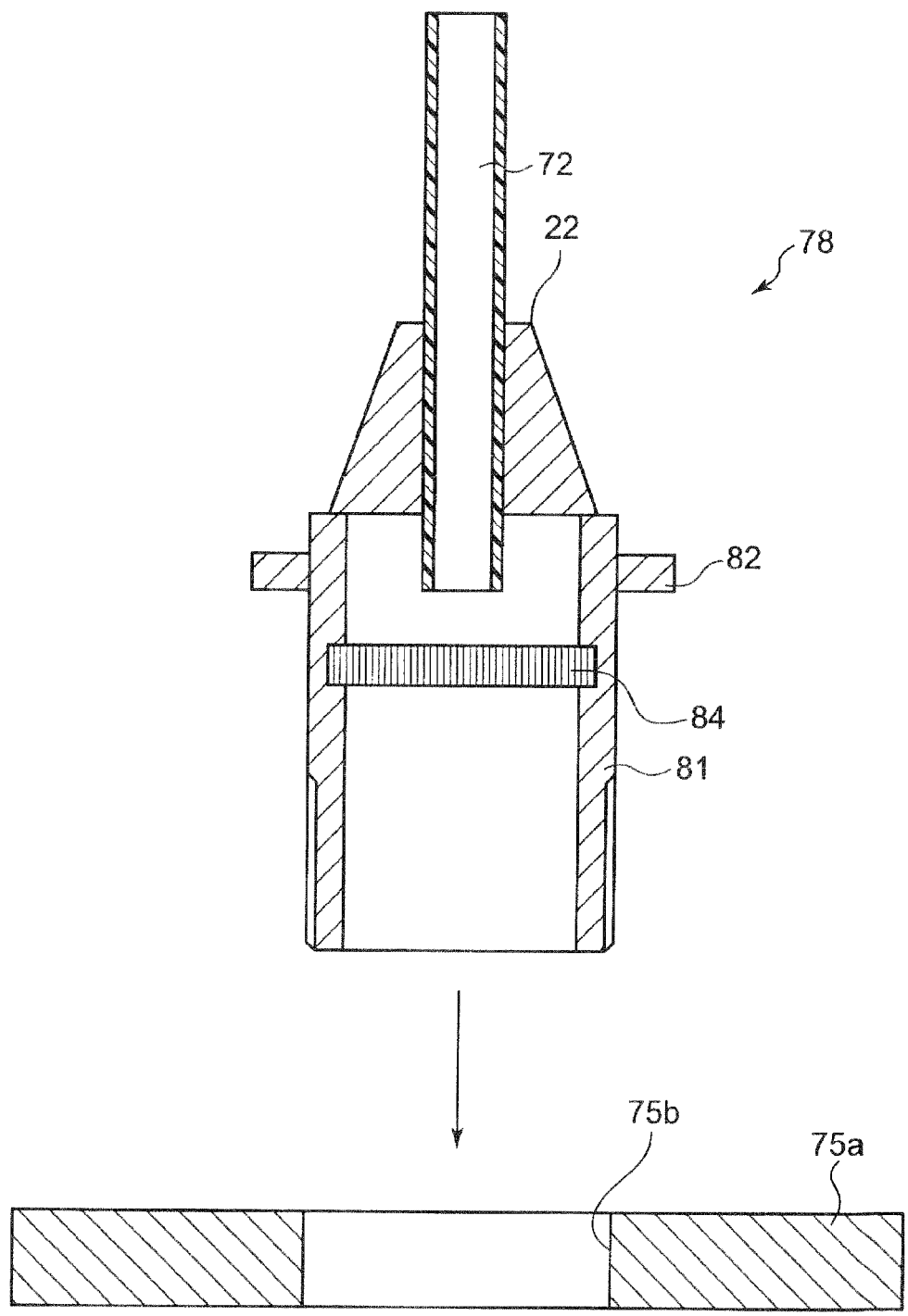
FIG. 18 is a diagram showing the way a head cylinder is inserted in the base unit shown in FIGS. 17A, 17B.

When the nozzle head 78 employing such a structure is assembled, as shown in FIG. 18, the head cylinder 81 is inserted in the opening 75b of the base unit 75a. The head cylinder 81 is retained by the base unit 75a in a rotatable manner.

Figure 19:
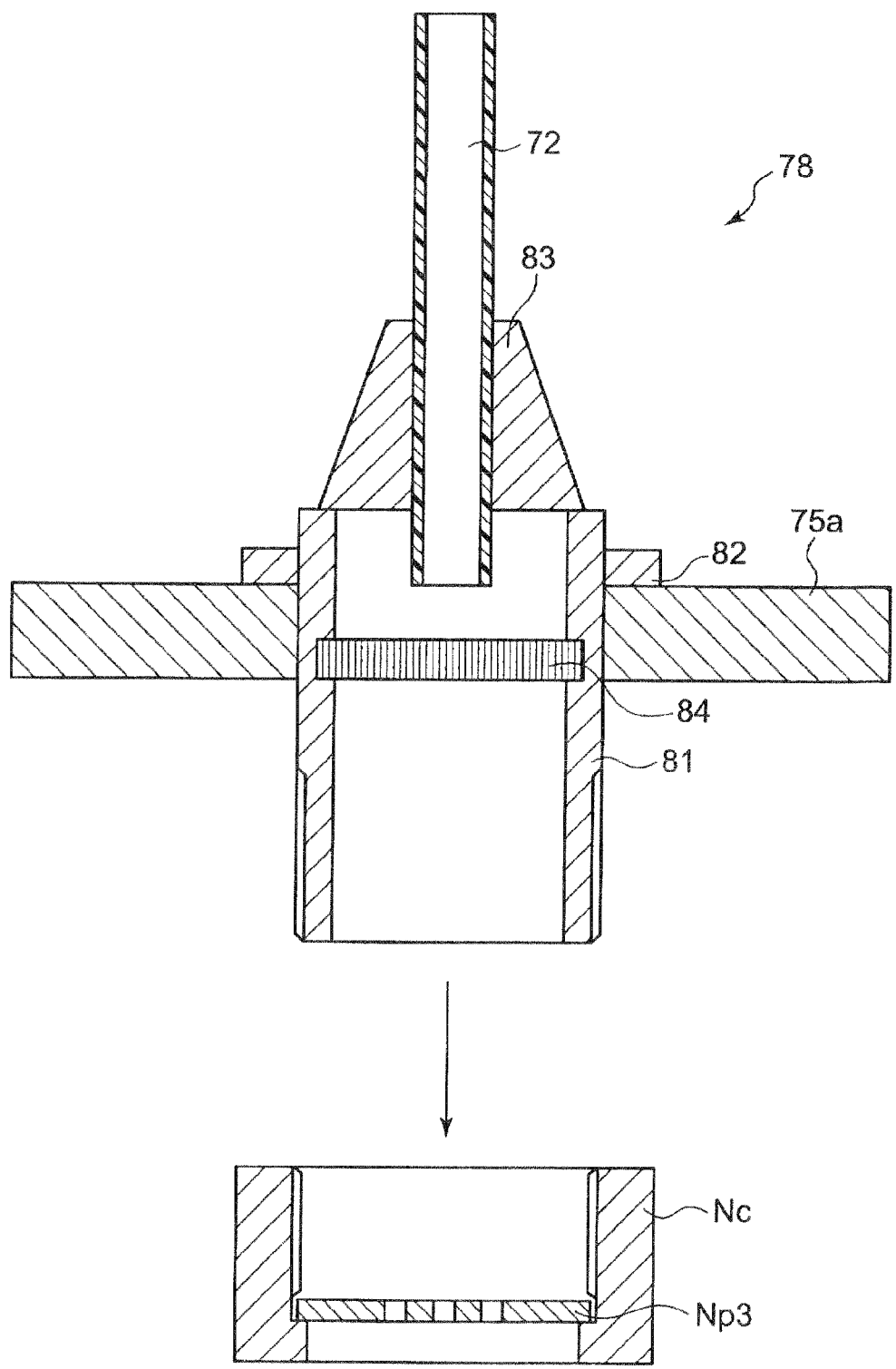
FIG. 19 is a diagram showing how a triple nozzle plate is attached to a nozzle cap.

In a case in which the triple nozzle plate Np3 is used as the nozzle plate, as shown in FIG. 19, the triple nozzle plate Np3 is set in the nozzle cap Nc. The head cylinder 81 has a male screw provided at the outer circumference surface of the lower end, and the nozzle cap Nc has a female screw provided at the inner circumference surface thereof.

As the male screw of the head cylinder 81 and the female screw of the nozzle cap Nc are engaged with each other and the nozzle cap Nc in which the triple nozzle plate Np3 is set is screwed in the head cylinder 81, the triple nozzle plate Np3 is sandwiched between the head cylinder 81 and the nozzle cap Nc and fixed therebetween.

When the triple nozzle plate Np3 is fixed, the center line c-c' of the triple nozzle plate Np3 needs to be matched with the sub scanning direction z-z', and at this time, the triangular mark put in the cylinder flange 82 needs to be aligned with the 0-degree angle mark of the base unit 75a.

For example, when the application width is set to be w31 (30) shown in FIG. 15B, as the triangular mark put in the cylinder flange 82 is aligned with the 30-degree mark put in the base unit 75a, the center line c-c' becomes inclined at 30 degree relative to the sub scanning direction z-z'. If the liquid 51 is applied to the substrate 31 in this condition the application width becomes w31(30).

Next, according to the second illustrative structure, as shown in FIGS. 20A to 20C, the triple nozzle plate Np3 is set at the leading end part of the nozzle head 78, and an angle of the center line c-c' relative to the sub scanning direction z-z' can be adjusted to an arbitrary angle and can be fixed.

As shown in FIG. 20A, the nozzle head 78 includes a main body, the triple nozzle plate Np3, the nozzle cap Nc, the plate hold-down screw 91, and a rotation stopper nut 92.

The main body comprises the head cylinder 81 and the coupling unit 83. The head cylinder 81 has a small-diameter part 81a with a small diameter provided at the leading end of the head cylinder 81, and the small-diameter part 81a has a male screw formed at the outer circumference surface thereof.

The plate hold-down screw 91 is for retaining the triple nozzle plate Np3, and has a female screw and a male screw formed on the inner circumference surface and the outer circumference surface, respectively.

The rotation stopper nut 92 is a nut for stopping rotation of the plate hold-down screw 91, and has a female screw which engages with the male screw formed on the outer circumference surface or the small-diameter part 81a of the head cylinder 81 and which is formed on the inner circumference surface of the rotation stopper nut 92.

When the nozzle head 78 employing such a structure is assembled, as shown in FIG. 20A, the triple nozzle plate Np3 is set in the nozzle cap Nc. The nozzle cap Nc has a female screw formed on the inner circumference surface thereof.

As shown in FIG. 20B, as the female screw formed on the inner circumference surface of the nozzle cap Nc and the male screw formed on the outer circumference surface of the plate hold-down screw 91 are engaged with each other and the nozzle cap Nc is screwed in the plate hold-down screw 91, the triple nozzle plate Np3 is sandwiched between the nozzle cap Nc and the plate hold-down screw 91 and fixed therebetween.

The female screw formed on the inner circumference surface of the rotation stopper nut 92 and the male screw formed on the outer circumference surface of the small-diameter part 81a are engaged with each other, and the rotation stopper nut 92 is screwed in the small-diameter part 81a of the head cylinder 81.

As shown in FIG. 20C, the female screw formed on the inner circumference surface of the plate hold-down screw 91 and the male screw formed on the outer circumference surface of the small-diameter part 81a of the head cylinder 81 are engaged with each other to screw in the plate hold-down screw 91 in the head cylinder 81, and the rotation stopper nut 92 is screwed in until it abuts the plate hold-down screw 91, so that the plate hold-down screw 91 and the nozzle cap Nc are fixed.

As the screw-in position of the plate hold-down screw 91 is adjusted, an angle of the center line c-c' of the triple nozzle plate Np3 relative to the sub scanning direction z-z' is adjusted. The head cylinder 81, the plate hold-down screw 91, and the rotation stopper nut 92 correspond to a rotating mechanism.

As explained above, according to the second embodiment, the multi nozzle plate is rotatable, and an application width can be changed without needing replacement of the multi nozzle plate.

The present invention can be changed and modified in various forms, and is not limited to the above-explained embodiments.

FIGS. 21A, 21B, and FIGS. 22A, 22B are diagrams showing a modified example of the multiple nozzle plate.

For example, in the first embodiment, the explanation was given of a case in which the plural nozzles have the same nozzle diameter. In contrast, as shown in FIGS. 21A, 21B, for example, in a triple nozzle plate Np3, plural nozzles with different nozzle diameters may be arranged for a single hydraulic system.

FIG. 21A shows a triple nozzle plate Np3 having the center nozzle with a larger nozzle diameter than those of nozzles at both ends. The liquid is applied mainly from the center nozzle, and liquid columns Lp are formed by the liquid discharged from the nozzles at both sides, thereby suppressing any stick out of the liquid to an adjoining pixel.

As the liquid is applied while the triple nozzle plate Np3 is rotated at 90 degree, the substrate is coated with the liquid column Lp from the smaller nozzle, and then coated with the liquid column Lp from the larger nozzle. This leads to suppression of any splash of the liquid and any stick out thereof.

FIG. 21B shows a triple nozzle plate Np3 with an inverted pattern, and has nozzles at both sides with a larger nozzle diameter than that of the nozzle at the center. According to this triple nozzle plate Np3, an effect of causing the liquid at an application-target part to disperse can be expected.

As shown in FIGS. 22A, 22B, a center line d-d' of the discharge direction of the plural nozzle holes may be inclined relative to a direction v'v' which is orthogonal to the top surface of the nozzle plate. The inclination angle of the center line d-d' of the discharge direction of the nozzle holes is set in such a manner as to incline toward the center direction of an application width of an application-target area. According to such a multi nozzle plate, as the inclination angle of each nozzle hole relative to a direction orthogonal to the top surface of the nozzle plate differs one by one, an effect of narrowing down an application-target area can be expected when the liquid is discharged from the plural nozzles. Moreover, as the distance from the nozzle to the application-target surface is adjusted, an effect of not only narrowing down the target area but also causing the liquid to disperse can be expected.

The plural nozzles may not only be arranged on a straight line relative to the nozzle plate but also be arranged at an arbitrary position, and at an arbitrary angle with an arbitrary size in order to cause any convergence, any dispersion, and any vortex of the liquid.

In the foregoing embodiments, the explanation was given of the double nozzle plate Np2 or the triple nozzle plate Np3, but the number of nozzle holes can be equal to three or larger.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. An application device comprising:
   a liquid tank for retaining a liquid; and
   a discharge unit to which the liquid is supplied from the liquid tank, and which discharges the liquid at a set application width to an application-target area provided to an object and extended in a first direction, and
   a moving unit which moves one of the discharge unit and the object relative to the other in the first direction along each application-target area,
   wherein the discharge unit comprises:
      a head cylinder filled with the liquid supplied from the liquid tank;
      a nozzle plate which is provided at one end of the head cylinder in a replaceable manner and which is provided with plural nozzle holes arranged in a straight line that discharge the liquid; and
      a rotating mechanism which makes a rotating angle of an arrangement direction of the plural nozzle holes of the nozzle plate changeable relative to the first direction in a plane along an upper surface of the substrate,
   wherein the application width is set by a width of the plural nozzle holes of the nozzle plate in a second direction that is orthogonal to the first direction, and the rotating angle is set to be an angle such that the application width becomes a value according to a width in the second direction of the application-target area of the object
   wherein a center line of a discharge direction in which at least one of the plural nozzle holes discharges the liquid is inclined toward a center direction of the width of the application-target area in the second direction relative to a direction orthogonal to a surface of the nozzle plate from which the liquid is discharged, and
   wherein the plural nozzle holes of the nozzle plate include a first nozzle hole and a second nozzle hole having respective center lines with inclined angles different from each other.

2. The application device according to claim 1, further comprising a nozzle cap which is so attached to the one end of the head cylinder as to bite the nozzle plate, and which makes the nozzle plate detachable from the head cylinder.

3. The application device according to claim 1, wherein the object is a light emitting panel having a light emitting device formed at the application-target area on a substrate, and the liquid is a solution which contains at least a material and a solvent both for forming a light emission layer of the light emitting device.

4. The application device according to claim 1, wherein the application target area comprises a plurality of application-target areas each extending in the first direction formed on a substrate that is the object, and
   wherein the moving unit moves one of the discharge unit and the substrate relative to the other in the second direction in the plane along the upper surface of the substrate when the discharge unit is moved relatively to a first or second end of each application-target area in the first direction.

5. The application device according to claim 4, wherein the discharge unit continuously discharges the liquid while the moving unit is moving one of the discharge unit and the substrate relative to the other in the first direction and in the second direction.

6. The application device according to claim 1, wherein the rotating mechanism comprises:
   a base unit which is coupled to the moving unit, and which is provided with an opening where the head cylinder is rotatably inserted; and
   a cylinder flange which is attached to the head cylinder, and which sets and fixes a rotating angle of the head cylinder relative to the base unit to a value according to the rotating angle of the arrangement direction of the plural nozzle holes.

7. The application device according to claim 1, wherein the rotating mechanism includes a nozzle cap which is so attached to one end of the head cylinder as to bite the nozzle plate, and
   wherein the nozzle cap fixes the nozzle plate at the one end of the head cylinder with the rotating angle of the arrangement direction of the plural nozzle holes being set.

8. The application device according to claim 1, wherein the plural nozzle holes of the nozzle plate include at least one first nozzle hole having a nozzle diameter set to be a first value, and at least one second nozzle hole having a nozzle diameter set to be a second value smaller than the first value.

9. The application device according to claim 8, wherein:
   the number of plural nozzle holes of the nozzle plate is at least three,
   the at least one nozzle hole having the nozzle diameter set to be the first value comprises a nozzle hole arranged at a center of an arrangement of the plural nozzle holes, and
   the at least one nozzle hole having the nozzle diameter set to be the second value comprises two nozzle holes arranged at both side ends of the arrangement of the plural nozzle holes.

10. The application device according to claim 8, wherein:
    the number of plural nozzle holes of the nozzle plate is at least three, the at least one nozzle hole having the nozzle diameter set to be the first value comprises two nozzle holes arranged at both side ends of an arrangement of the plural nozzle holes, and the at least one nozzle hole having the nozzle diameter set to be the second value comprises a nozzle hole arranged at a center of the arrangement of the plural nozzle holes.

11. An application device comprising:

a liquid tank for retaining a liquid;

a discharge unit to which the liquid is supplied from the liquid tank, and which discharges the liquid to at least one application-target area extending in a first direction formed on a substrate; and a moving unit which moves one of the discharge unit and the substrate relative to the other along the application-target area, wherein the moving unit moves the discharge unit relatively in the first direction along each application-target area, and moves the discharge unit in a second direction orthogonal to the first direction in a plane along an upper surface of the substrate when moving the discharge unit to a first or second end of the application-target area in the first direction, wherein the discharge unit comprises a head cylinder filled with the liquid supplied from the liquid tank, a nozzle plate which is provided at one end of the head cylinder, and which is provided with plural nozzle holes arranged side by side on a straight line, the plural nozzle holes each discharging the liquid, and a rotating mechanism which makes a rotating angle of an arrangement direction of the plural nozzle holes of the nozzle plate changeable relative to the first direction in the plane along the upper surface of the substrate, and wherein the rotating angle is set to be a value such that an application width set by a width of the plural nozzle holes of the nozzle plate in the second direction in accordance with the rotating angle becomes a value corresponding to a width of the application-target area of the object in the second direction wherein a center line of a discharge direction in which at least one of the plural nozzle holes discharges the liquid is inclined toward a center direction of the width of the application-target area in the second direction relative to a direction orthogonal to a surface of the nozzle plate from which the liquid is discharged, and wherein the plural nozzle holes of the nozzle plate include a first nozzle hole and a second nozzle hole having respective center lines with inclined angles different from each other.

* * * * *